United States Patent
Arai et al.

(10) Patent No.: US 6,953,717 B2
(45) Date of Patent: Oct. 11, 2005

(54) METHOD OF MANUFACTURING SEMICONDUCTOR DEVICE

(75) Inventors: Yasuyuki Arai, Atsugi (JP); Shinji Maekawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/959,071

(22) Filed: Oct. 7, 2004

(65) Prior Publication Data

US 2005/0048684 A1 Mar. 3, 2005

Related U.S. Application Data

(62) Division of application No. 10/112,717, filed on Apr. 2, 2002, now Pat. No. 6,809,023.

(30) Foreign Application Priority Data

Apr. 6, 2001 (JP) .......................................... 2001-109295

(51) Int. Cl.⁷ ........................... H01L 21/20; H01L 21/00
(52) U.S. Cl. ........................ 438/166; 438/482; 438/486; 438/487
(58) Field of Search .................. 438/482, 486–487, 438/166, 150

(56) References Cited

U.S. PATENT DOCUMENTS

| | | | |
|---|---|---|---|
| 5,365,081 A | 11/1994 | Yamazaki et al. | |
| 5,559,042 A | 9/1996 | Yamazaki et al. | |
| 5,643,826 A | 7/1997 | Ohtani et al. | |

(Continued)

FOREIGN PATENT DOCUMENTS

| | | |
|---|---|---|
| JP | 02-194620 A | 8/1990 |
| JP | 04-120721 A | 4/1992 |
| JP | 07-183540 A | 7/1995 |
| JP | 10-270363 A | 10/1998 |
| JP | 11-026473 | 1/1999 |

OTHER PUBLICATIONS

U.S. Appl. No.: 10/036,480 filed Jan. 7, 2002 is related to the present invention.

Wolf et al. "Silicon Processing for the VLSI Era" 1986, vol. 1, pp. 179, 194.

*Primary Examiner*—Thanh Nguyen
(74) *Attorney, Agent, or Firm*—Nixon Peabody LLP; Jeffrey L. Costellia

(57) ABSTRACT

A grain size of a crystal grain in a crystalline semiconductor film obtained by a thermal crystallization method using a metallic element is reduced. Thus, the number of crystal grains in active regions of a device is made uniform. The thermal crystallization method using a metallic element is performed for a semiconductor film formed on an insulating film formed at a lower temperature than that at formation of the semiconductor film and that at crystallization of the semiconductor film. By thermal treatment in a step of crystallizing the semiconductor film, stress of the insulating film is applied to the semiconductor film, thus causing distortion in the semiconductor film. When the distortion is caused, surface energy and a chemical potential of the semiconductor film are changed to promote the generation of a natural nucleus. Therefore, since a generation density of the crystal nucleus is increased, a grain size of a crystal grain can be reduced.

19 Claims, 19 Drawing Sheets

U.S. PATENT DOCUMENTS

| | | |
|---|---|---|
| 5,736,439 A | 4/1998 | Yamazaki et al. |
| 5,923,962 A | 7/1999 | Ohtani et al. |
| 6,077,731 A | 6/2000 | Yamazaki et al. |
| 6,121,660 A | 9/2000 | Yamazaki et al. |
| 6,242,759 B1 | 6/2001 | Yamazaki et al. |
| 6,285,042 B1 | 9/2001 | Ohtani et al. |
| 6,303,963 B1 | 10/2001 | Ohtani et al. |
| 6,335,541 B1 | 1/2002 | Ohtani et al. |
| 6,337,236 B2 | 1/2002 | Yamazaki et al. |
| 6,358,766 B1 | 3/2002 | Kasahara |
| 6,465,288 B1 * | 10/2002 | Ohnuma ..................... 438/166 |
| 6,489,222 B2 | 12/2002 | Yoshimoto |
| 6,521,912 B1 | 2/2003 | Sakama et al. |
| 6,589,829 B2 | 7/2003 | Yamazaki et al. |
| 6,599,788 B1 | 7/2003 | Kawasaki et al. |
| 6,646,284 B2 | 11/2003 | Yamazaki et al. |
| 6,686,262 B2 * | 2/2004 | Yamazaki et al. .......... 438/486 |
| 2002/0084464 A1 | 7/2002 | Yamazaki et al. |
| 2002/0179908 A1 | 12/2002 | Arao |

\* cited by examiner

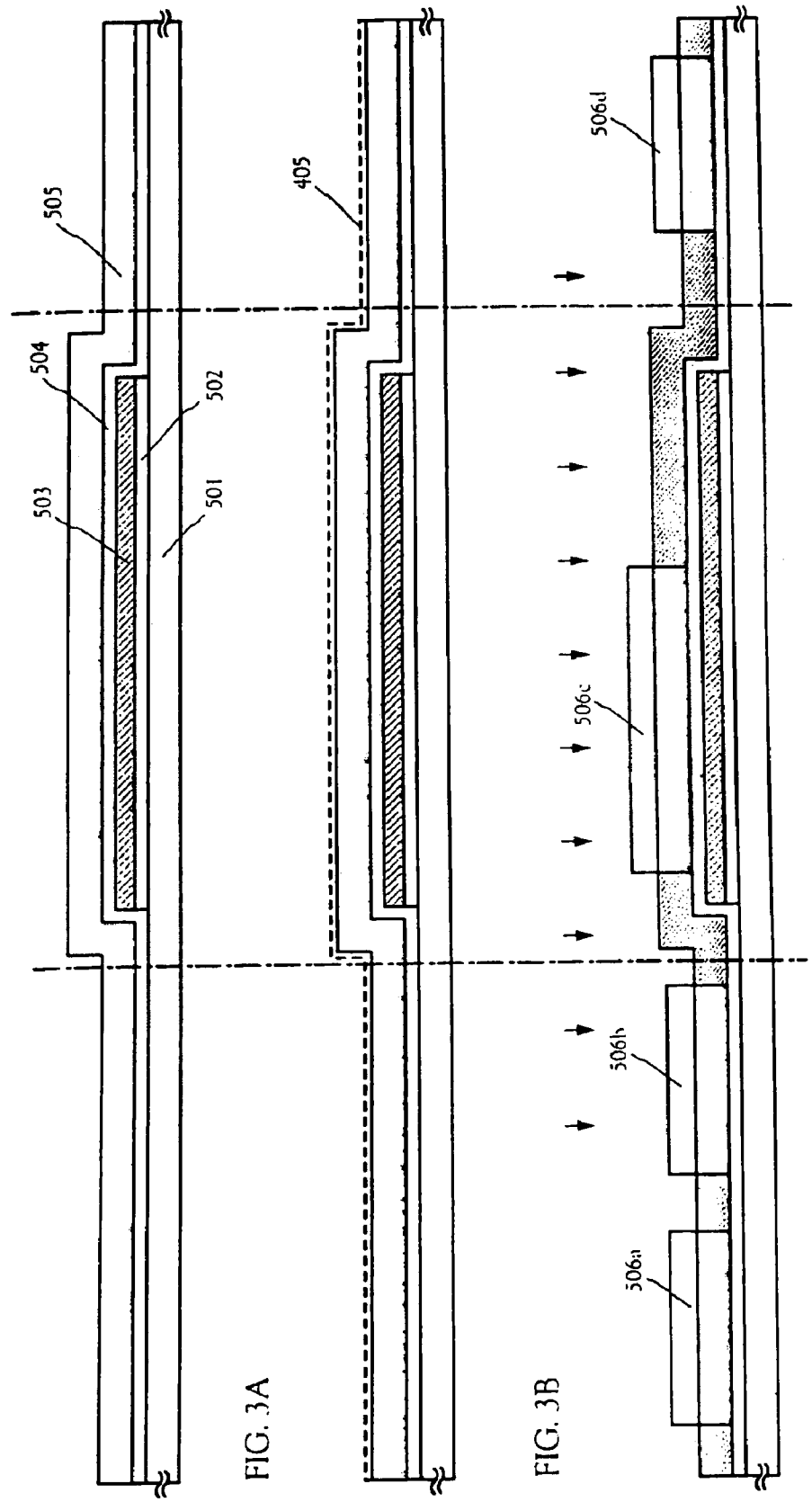

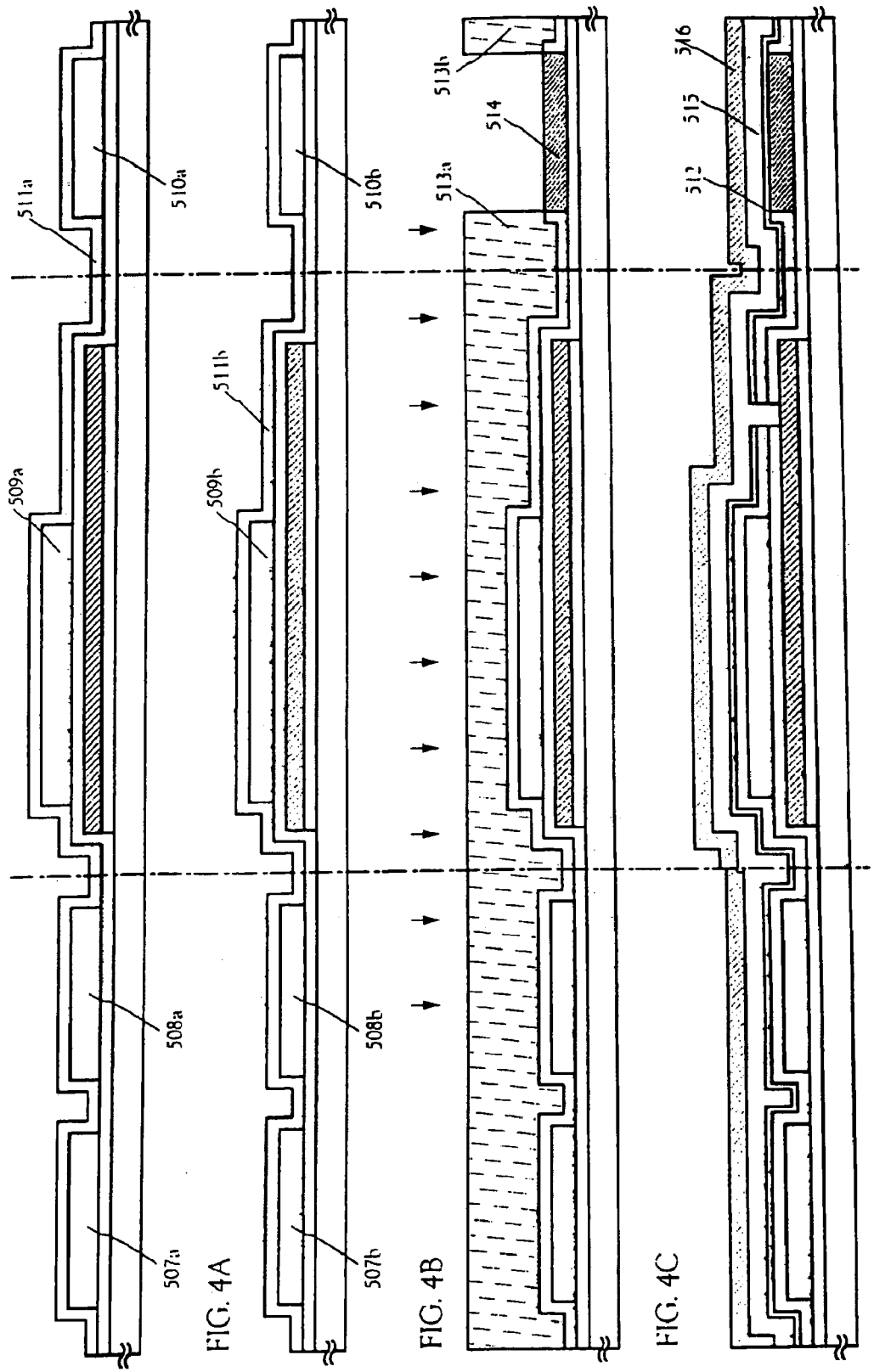

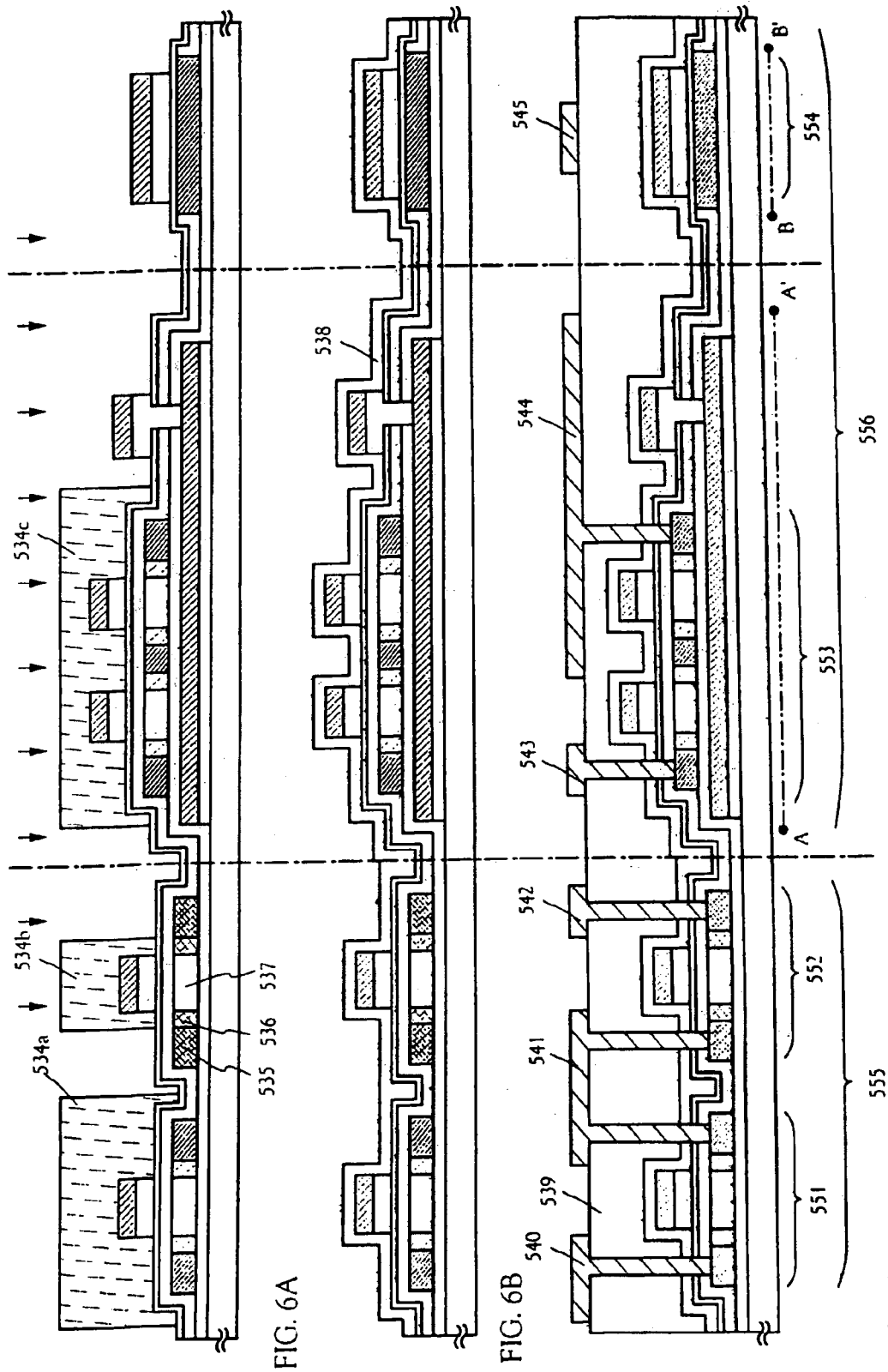

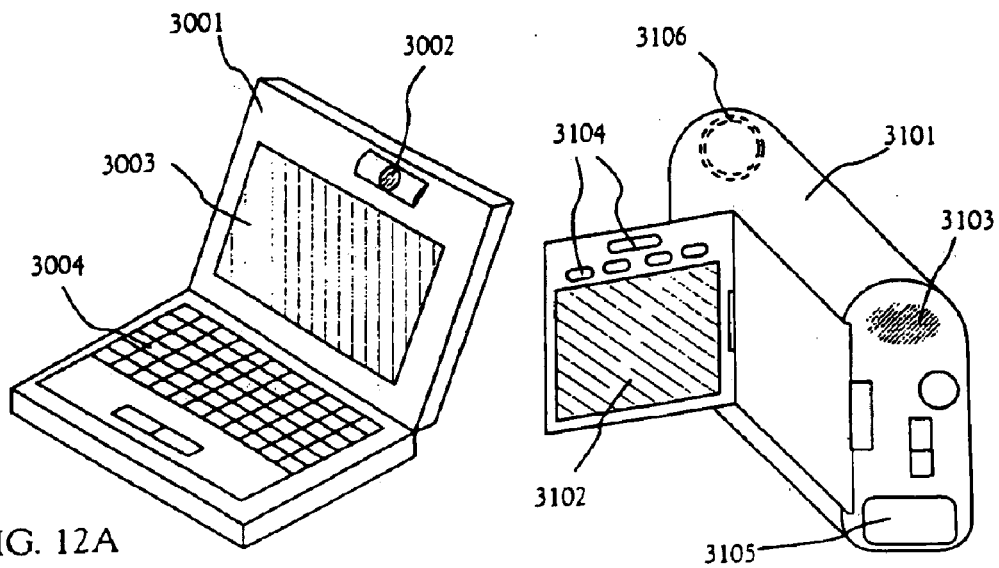
FIG. 12A
FIG. 12B
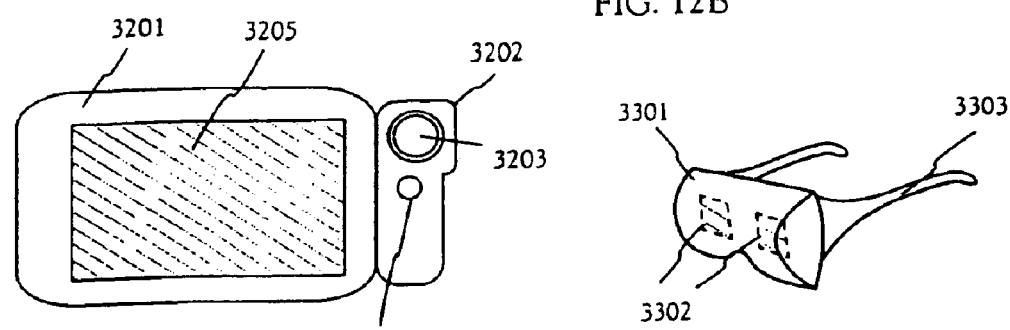
FIG. 12C
FIG. 12D
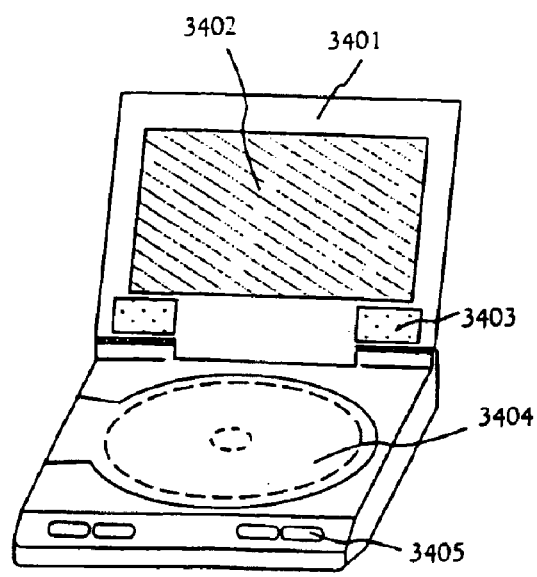
FIG. 12E
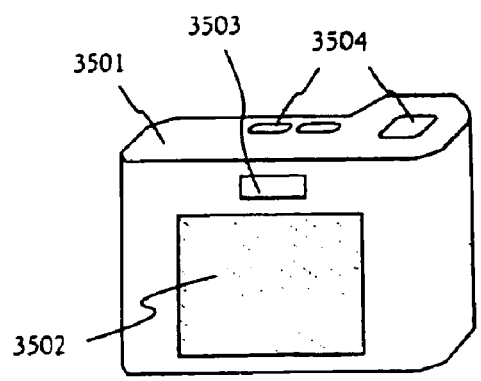
FIG. 12F

METHOD OF MANUFACTURING SEMICONDUCTOR DEVICE

CROSS-REFERENCE TO RELATED APPLICATION

This application is a divisional of Application No. 10/112,717 filed Apr. 2, 2002, now patented as U.S. Pat. No. 6,809,023.

BACKGROUND OF THE INVENTION

1. Field of the Invention

The present invention relates to a method of manufacturing a semiconductor device having a circuit composed of thin film transistors (hereinafter referred to as TFTs). The present invention relates to, for example, an electro-optical device represented by a liquid crystal display device and a structure of electrical equipment (electronic apparatus) on which an electro-optical device is mounted as a part. Also, the present invention relates to a method of manufacturing the device. Note that the semiconductor device in this specification indicates a device in general, which can function by utilizing a semiconductor characteristic, and the electro-optical device and the electrical equipment (electronic apparatus) each fall under the category of the semiconductor device.

2. Description of the Related Art

A technique for performing a thermal anneal method, a laser anneal method, or both of a thermal anneal method and a laser anneal method for crystallizing an amorphous semiconductor film formed on an insulating substrate made of glass or the like to form a crystalline semiconductor film or improving crystallinity thereof is widely studied. A silicon film is often used as the above semiconductor film. Note that a crystalline semiconductor film in this specification indicates a semiconductor film having a crystalline structure.

A crystalline semiconductor film has significantly higher mobility than an amorphous semiconductor film. Thus, when the crystalline semiconductor film is used, for example, an active matrix liquid crystal display device (semiconductor device in which thin film transistors (TFTs) for a pixel portion and a driver portion are formed on a single substrate) which cannot be realized by a semiconductor device produced using a conventional amorphous semiconductor film can be manufactured.

However, when an amorphous semiconductor film formed by a plasma CVD method or a sputtering method is subjected to a thermal anneal method or a laser anneal method to form a crystalline semiconductor film, a crystal orientation thereof becomes out of control because of its arrangement in an arbitrary direction in many cases. Thus, when a TFT is manufactured using the crystalline semiconductor film, this becomes a factor for limiting an electrical characteristic thereof.

There is an EBSP (electron backscatter diffraction pattern) method as a method of analyzing a crystal orientation of the surface of the crystalline semiconductor film. The EBSP is a method of analyzing a crystal orientation of the surface of the crystalline semiconductor film. According to this method, crystal orientations in which crystal grains at respective measurement points are directed to the surface can be indicated in different colors. Alternatively, a certain measurement point is to be noted and a region located within a deviation angle of a crystal orientation set by a measurer (allowable deviation angle) can be separately indicated in an adjacent point. The allowable deviation angle can be freely set by a measurer. In this specification, the allowable deviation angle is set to be 15°, and when a certain point is to be noted, a region that a deviation angle of a crystal orientation in an adjacent point is 15° or smaller is called a grain. The reason why the allowable deviation angle is set to be 15° is that a general set value is 15°. The grain is composed of a plurality of crystal grains. However, since an allowable deviation angle of a crystal orientation in the grain is small, it can be microscopically assumed to be a single crystal grain.

Also, there is a method described in Japanese Patent Application Laid-open No. Hei 7-183540 as one of the methods of crystallizing, an amorphous semiconductor film. Here, the method will be briefly described. First, a metallic element such as nickel, palladium, or lead in a very small amount is added to an amorphous semiconductor film. A plasma processing method, an evaporation method, an ion implantation method, a sputtering method, a solution coating method, or the like is preferably used as the adding method. After the addition, the amorphous semiconductor film is exposed to, for example, a nitrogen atmosphere at 550° C. for 4 hours to form a crystalline semiconductor film. When a TFT is made from such a crystalline semiconductor film, not only the improvement of field effect mobility but also a reduction in a subthreshold coefficient (S value) are produced. Thus, an electrical characteristic can be dramatically improved. A heating temperature, a heating time, and the like, which are most suitable for crystallization, depend on the amount of metallic elements to be added and a state of the amorphous semiconductor film. Also, when this crystallization method is used, it is confirmed that an alignment of a crystal orientation can be improved to be a single direction.

FIG. 16A shows a grain in a semiconductor film formed using the above crystallization method. Concretely, an amorphous silicon film having a film thickness of 65 nm is formed on a synthetic quartz glass substrate by an LPCVD apparatus. After that, a nickel acetate aqueous solution (weight converting concentration: 5 ppm, volume: 10 ml) is applied onto the surface of the amorphous silicon film by spin coating to thereby form a metal containing layer, and thermal treatment (at 600° C. for 12 hours) is performed for crystallizing the semiconductor film. Then, in order to observe a crystal orientation of a grain and a boundary thereof by an optical microscope, the semiconductor film is immersed in 0.5% hydrofluoric acid for 30 seconds to thereby remove an oxide film and further immersed in a KOH/IPA solution for 30 seconds. After such anisotropic etching, a grain observed by an optical microscope (bright field reflection mode, 200 times) is shown in FIG. 16A. FIG. 16B is a schematic view of FIG. 16A.

Incidentally, it is known that there is an internal stress in a thin film formed by a known film formation technique such as a CVD method (chemical vapor deposition method) or a sputtering method. The internal stress includes an intrinsic stress and a thermal stress caused by a difference in thermal expansion coefficients between a thin film and a substrate.

With respect to the thermal stress, its influence can be neglected by considering a material of a substrate and a process temperature. However, a mechanism for generating the intrinsic stress is not necessarily clarified, and it is considered that the intrinsic stress is generated by complicated relations among a growth process of a film and changes in a phase and in a composition due to later thermal treatment and the like.

Generally, the internal stress includes a tensile stress and a compression stress. As shown in FIG. 17A, when a thin film 401 is to be contracted against a substrate 402, since the substrate 402 pulls the thin film in such a direction that the contraction is hindered, they are deformed such that the thin film is located inside the substrate. This is called a tensile stress. On the other hand, as shown in FIG. 17B, when the thin film 401 is to be extended, since the substrate 402 is contracted, they are formed such that the thin film 401 is located outside the substrate. This is called a compression stress. Generally, in many cases, a tensile stress is indicated by a symbol "+" and a compression stress is indicated by a symbol "−".

In the case where TFTs are made from a crystalline semiconductor film, when the crystalline semiconductor film is divided for element isolation by patterning, variations are caused in active regions, in particular, channel forming regions, of respective TFTs. That is, there are an active region in which a large number of grain boundaries exist in a grain, an active region which is composed of only substantially a single grain, and the like. Also, when a semiconductor film is crystallized using a metallic element for promoting crystallization, a crystal grain produced using the metallic element as a nucleus and a crystal grain produced by generating a natural nucleus (in this specification, a nucleus in the case where a nucleus of the produced crystal grain is not a metallic element is defined as the natural nucleus) are mixed. Thus, a variation in a physical property of the semiconductor film is caused. Note that, when a temperature becomes high such as 600° C. or higher or a time required for crystallization becomes long, it is known that the natural nucleus is easy to generate. Such a variation becomes a cause of a variation in an electrical characteristic and a cause of uneven display in the case where the TFT is used for a display portion of various kinds of semiconductor devices.

Therefore, a method of suppressing a variation in the number of rains in active regions, in particular, channel forming regions, of the respective TFTs by reducing a size of a grain is considered. In order to reduce a size of a grain, a generation density of a crystal nucleus may be increased. In other words, surface energy of the semiconductor film is decreased or a chemical potential of the semiconductor film is increased to reduce a radius of a critical nucleus and increase a generation density of a crystal nucleus. As one method of realizing this, there is a method of adding a large amount of metallic elements for promoting crystallization to the semiconductor film to change surface energy and a chemical potential of the semiconductor film. When this method is used, since a large number of crystal nuclei due to the metallic element are generated, a size of a grain can be reduced. However, in the case of the above method, there is a problem that excessive amounts of metallic elements are left as metallic compounds in high resistance regions (channel forming region and offset region). Since the metallic compounds are easy to flow a current, resistances of regions formed as the high resistance regions are reduced and this becomes a cause of deteriorating, stability and reliability in an electrical characteristic of a TFT.

SUMMARY OF THE INVENTION

The present invention is a technique for solving such a problem and a technique for reducing a size of a grain in a crystalline semiconductor film obtained using a metallic element without increasing the amount of metallic elements to be used to average the number of grains in active regions, in particular, channel forming regions, of respective TFTs as much as possible. An object of the present invention is to realize the improvements of an operational characteristic and reliability of a semiconductor device in an electro-optical device and a semiconductor device represented by an active matrix liquid crystal display device manufactured using TFTs.

The present invention is characterized in that a semiconductor film is formed on an insulating film formed at a lower temperature than a temperature in a formation of the semiconductor film and a temperature in a step of crystallizing the semiconductor film, and then a thermal crystallization method using a metallic element is performed.

As described above, when surface energy and a chemical potential of the semiconductor film is changed by any method to reduce a radius of a critical nucleus, a generation density of a crystal nucleus can be increased. Also, when a thin film is exposed to a certain temperature once, a stress is not changed even if it is exposed to a lower temperature than the certain temperature. However, if it is exposed to a higher temperature, a stress is increased. Thus, according to the present invention, a stress of the insulating film against the semiconductor film is increased by thermal treatment in a step of crystallizing the semiconductor film to cause distortion in the semiconductor film.

A method of manufacturing a semiconductor device includes, as manufacturing steps of the present invention, the steps of: forming an insulating film at a first temperature; forming a semiconductor film on the insulating film at a second temperature; adding a metallic element to the semiconductor film; and performing thermal treatment at a third temperature for the semiconductor film to which the metallic element is added, to form a crystalline semiconductor film, which is characterized in that the third temperature is set to be higher than the first temperature and the second temperature.

A method of manufacturing a semiconductor device includes, as other manufacturing steps of the present invention, the steps of: forming an insulating film at a first temperature; forming a semiconductor film on the insulating film at a second temperature; adding a metallic element to the semiconductor film; and performing thermal treatment at a third temperature for the semiconductor film to which the metallic element is added, to form a crystalline semiconductor film, which is characterized in that the third temperature is set to be higher than the first temperature and the second temperature to increase a stress of the insulating film.

A method of manufacturing a semiconductor device includes, as other manufacturing steps of the present invention, the steps of: forming an insulating film at a first temperature; forming a semiconductor film on the insulating film at a second temperature; adding a metallic element to the semiconductor film; and performing thermal treatment at a third temperature for the semiconductor film to which the metallic element is added, to increase a stress of the insulating film and thus to form a crystalline semiconductor film in which a generation density of a crystal nucleus is increased by the increased stress, which is characterized in that the third temperature is higher than the first temperature and the second temperature.

In the above respective manufacturing steps, it is characterized in that the third temperature is higher than the first temperature. When the insulating film formed at the first temperature is exposed to the third temperature that is higher than the first temperature, the stress is increased. With this increase, distortion is caused in the semiconductor film formed on the insulating film. When the distortion is caused, the surface energy and the chemical potential of the semiconductor film are changed to promote the generation of the crystal nucleus. Thus, the generation density of the crystal nucleus can be increased to reduce the size of the grain. When the present invention is implemented, for example, the grain size of about 100 μm to 150 μm can be made to be about 60 μm or less (typically, 20 μm to 60 μm). Therefore, since the number of grains included in the channel forming regions are averaged, there are such effects that a variation in an electrical characteristic of a manufactured TFT is reduced and uneven display of a display portion for which the TFT is used is reduced.

Also, it is characterized in that the third temperature is higher than the second temperature. The second temperature may be higher than the first temperature. The reason for this is as follows. That is, when a thin film is exposed to a certain temperature once, a stress is not changed even if it is exposed to a lower temperature than the certain temperature. However, if it is exposed to a higher temperature, a stress is increased. Thus, in the case where the second temperature is lower than the third temperature, when the insulating film is exposed to the third temperature, a stress is increased. With this increase, distortion can be caused in the semiconductor film.

Also, the insulating film may have a laminate structure in the above respective manufacturing steps. A film containing nitrogen is preferably used as the insulating film. A glass substrate, a quartz substrate, a silicon substrate, a plastic substrate, a metallic substrate, a stainless substrate, a flexible substrate, or the like can be used as a substrate for forming the insulating film. As the glass substrate, there is a substrate made of glass such as barium borosilicate glass or aluminoborosilicate glass. The flexible substrate is a film-shaped substrate made of PET, PES, PEN, acrylic, or the like. When a semiconductor device is manufactured using the flexible substrate, weight reduction is expected. When a barrier layer such as an aluminum film (AlON, AlN, AlO, or the like), a carbon film (DLC (diamond-like carbon) or the like), or an SiN film is formed as a single layer or a multilayer on the surface of the flexible substrate or on both front and back surfaces thereof, the durability and the like are improved. Thus, such a film is preferably formed.

Also, there is an amorphous semiconductor film, a microcrystalline semiconductor film, or the like as the semiconductor film in the above respective manufacturing steps. An amorphous silicon film or a compound semiconductor film having an amorphous structure such as an amorphous silicon germanium film may be applied.

Also, in the above respective manufacturing steps, the metallic element is one kind or plural kinds of elements selected from the group consisting of Fe, Co, Ni, Ru, Rh, Pd, Os, Ir, Pt, Cu, Ag, Au, Sn, and Sb.

Further, a method of manufacturing a semiconductor device includes, as other manufacturing steps of the present invention, the steps of: forming a first insulating film at a first temperature; forming a second insulating film on the first insulating film at a second temperature; forming a semiconductor film on the second insulating film at a third temperature; adding a metallic element to the semiconductor film; and performing thermal treatment at a fourth temperature for the semiconductor film to which the metallic element is added, to form a crystalline semiconductor film, which is characterized in that the first temperature is set to be higher than the fourth temperature and the fourth temperature is set to be higher than the second temperature and the third temperature.

Further, a method of manufacturing a semiconductor device includes, as other manufacturing steps of the present invention, the steps of: forming a first insulating film at a first temperature; forming a second insulating film on the first insulating film at a second temperature; forming a semiconductor film on the second insulating film at a third temperature; adding a metallic element to the semiconductor film; and performing thermal treatment at a fourth temperature for the semiconductor film to which the metallic element is added, to form a crystalline semiconductor film, which is characterized in that the first temperature is set to be higher than the fourth temperature and the fourth temperature is set to be higher than the second temperature and the third temperature to increase a stress of the insulating film.

Further, a method of manufacturing a semiconductor device includes, as other manufacturing steps of the present invention, the steps of: forming a first insulating film at a first temperature; forming a second insulating film on the first insulating film at a second temperature; forming a semiconductor film on the second insulating film at a third temperature; adding a metallic element to the semiconductor film; and performing thermal treatment at a fourth temperature for the semiconductor film to which the metallic element is added, to increase a stress of the second insulating film and thus to form a crystalline semiconductor film in which a generation density of a crystal nucleus is increased by the increased stress, which is characterized in that the first temperature is higher than the fourth temperature and the fourth temperature is higher than the second temperature and the third temperature.

The above respective manufacturing steps are characterized in that the first temperature is higher than the fourth temperature. When a thin film is exposed to a certain temperature once, a stress is not changed even if it is exposed to a lower temperature than the certain temperature. However, if it is exposed to a higher temperature, a stress is increased. When the first insulating film and the second insulating film are exposed to the fourth temperature and a stress is increased in both the first insulating film and the second insulating film, there is a possibility that no distortion is caused in the semiconductor by canceling out the stresses each other. Thus, the first insulating film is formed in advance at the first temperature that is higher than the fourth temperature. Then, when the first insulating film is exposed to the fourth temperature, since a stress is increased in the second insulating film, it is particularly effective to cause distortion in the semiconductor film.

Also, in the above respective manufacturing steps, it is characterized in that the fourth temperature is higher than the second temperature. When the second insulating film formed at the second temperature is exposed to the fourth temperature higher than the second temperature, the stress is increased. With this increase, distortion is caused in the semiconductor film formed on the second insulating film. When the distortion is caused, the surface energy and the chemical potential of the semiconductor film are changed to promote the generation of the crystal nucleus. Thus, the generation density of the crystal nucleus can be increased to reduce the size of the grain. When the present invention is implemented, for example, the grain size of about 100 μm to 150 μm can be made to be about 60 μm or less (typically, 20 μm to 60 μm).

Also, it is characterized in that the fourth temperature is higher than the third temperature. The third temperature may be higher than the first temperature and the second temperature. The reason for this is as follows. That is, when a thin film is exposed to a certain temperature once, a stress is not changed even if it is exposed to a lower temperature than the certain temperature. However, if it is exposed to a higher temperature, a stress is increased. Thus, in the case where the third temperature is lower than the fourth temperature, when the second insulating film is exposed to the fourth temperature, a stress is increased. With this increase, distortion can be caused in the semiconductor film.

Also, a film containing nitrogen is preferably used as the second insulating film in the above respective manufacturing steps. A glass substrate, a quartz substrate, a silicon substrate, a plastic substrate, a metallic substrate, a stainless substrate, a flexible substrate, or the like can be used as a substrate for forming the first insulating film.

Also, there is an amorphous semiconductor film, a microcrystalline semiconductor film, or the like as the semiconductor film in the above respective manufacturing steps. An amorphous silicon film or a compound semiconductor film having an amorphous structure such as an amorphous silicon germanium film may be applied.

Also, in the above respective manufacturing steps, the metallic element is one kind or plural kinds of elements selected from the group consisting of Fe, Co, Ni, Ru, Rh, Pd, Os, Ir, Pt, Cu, Ag, Au, Sn, and Sb.

When the present invention as described above is applied the performance of the semiconductor device can be greatly improved. For example, in the case of TFTs, the number of grains included in respective channel forming regions can be averaged. Thus, variations in an on-current value (value of a drain current flowing when a TFT is in an on-state), an off-current value (value of a drain current flowing when a TFT is in an off-state), a threshold voltage, an S value, and field effect mobility can also be reduced.

BRIEF DESCRIPTION OF THE DRAWINGS

FIGS. 3A to 3C are cross sectional views indicating steps of manufacturing pixel TFTs and TFTs of a driver circuit of Embodiment 3;

FIGS. 4A to 4D are cross sectional views indicating steps of manufacturing the pixel TFTs and the TFTs of the driver circuit of Embodiment 3;

FIGS. 6A to 6C are cross sectional views indicating steps of manufacturing the pixel TFTs and the TFTs of the driver circuit of Embodiment 3;

FIGS. 12A to 12F show examples of electrical apparatuses of Embodiment 7;

DETAILED DESCRIPTION OF THE PREFERRED EMBODIMENTS

[Embodiment Mode]

An embodiment mode of the present invention will be described using cross sectional views shown in FIGS. 1A to 1C.

Figure 1A:
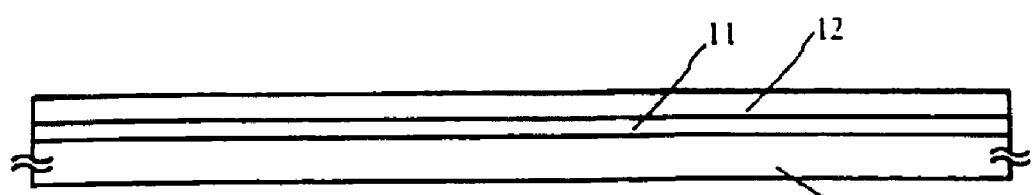
FIGS. 1A to 1C show fabrication steps of a semiconductor film of the present invention.
Figure 1B:
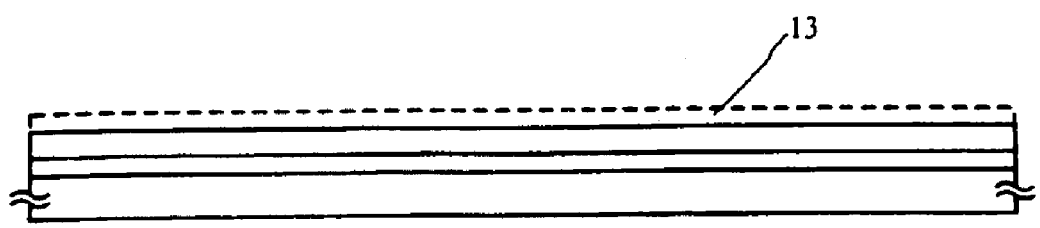
Figure 1C:
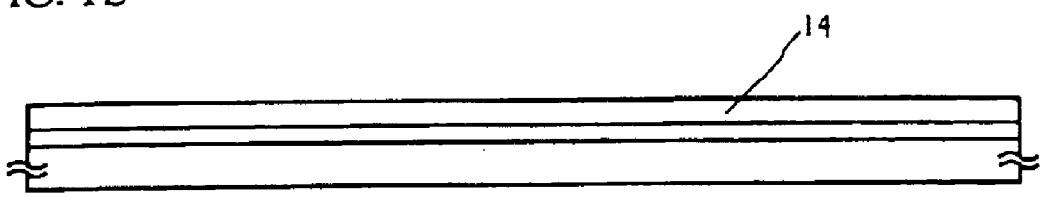

In FIG. 1A, a synthetic quartz glass substrate or a glass substrate made of no alkali glass such as barium borosilicate glass or aluminoborosilicate glass may be used as a substrate 10. For example, #7059 glass, #1737 glass, or the like which is produced by Corning corp. can be preferably used. Also, a plastic substrate having a heat resistance to a processing temperature in this embodiment mode may be used.

A base insulating film 11 as a silicon nitride film, a silicon oxynitride film, a silicon oxide film, or the like is formed on the substrate 10 at a lower temperature than that in a crystallization step performed as a later step by a known means (LPCVD (low pressure CVD) method, a plasma CVD method, or the like). Of course, the base insulating film may not be a single layer and may have a laminate structure of two layers or more. A temperature in the case where the base insulating film which is in contact with at least a semiconductor film is formed is set to be lower than a temperature in a step of crystallizing the semiconductor film. Thus, with stress increased in an uppermost layer of the base insulating, film, distortion can be caused in the semiconductor film and a generation density of a crystal nucleus can be increased.

Next, a semiconductor film 12 is formed to have a thickness of 10 nm to 200 nm (preferably, 30 nm to 100 nm) by a known means such as a plasma CVD method or a sputtering method. There is an amorphous semiconductor film, a microcrystalline semiconductor film, or the like as the semiconductor film 12 and a compound semiconductor film having an amorphous structure such as an amorphous silicon germanium film may be applied.

After that, the semiconductor film is crystallized by a thermal crystallization method using a metallic element such as nickel. First, a layer including a metallic element for promoting crystallization (metal containing layer 13) is formed. There is nickel, palladium, lead, or the like as the metallic element. A plasma treatment method, an evaporation method, anion implantation method, a sputtering method, a solution applying method, or the like may be used as an adding method.

Then, thermal treatment is performed to crystallize the semiconductor film. This thermal treatment is performed by a thermal anneal method using a furnace anneal furnace. The thermal anneal method is preferably performed in a nitrogen atmosphere at an oxygen concentration of 1 ppm or lower, preferably 0.1 ppm or lower and at 400° C. to 700° C., typically 500° C. to 550° C. for about 4 hours to 12 hours. A rapid thermal anneal method (RTA method) or the like may be used as another thermal treatment in addition to the thermal anneal method.

Also, the crystallization of the semiconductor film can be performed by combination with a known crystallization method (laser crystallization method or the like) other than a thermal crystallization method using a metallic element.

Since the thermal treatment is performed at a higher temperature than that in the formation of the base insulating film 11, a tensile stress in the base insulating film 11 is increased. With this increase, distortion is caused in the semiconductor film 12 formed on the base insulating film 11. When the distortion is caused, surface energy and a chemical potential of the semiconductor film are changed to increase a generation density of a crystal nucleus. Thus, a size of a grain to be produced is reduced.

When TFTs are made from a thus formed crystalline semiconductor film 14, the number of grains included in active regions, in particular, channel forming regions can be averaged. Also, a variation in an electrical characteristic can be reduced and uneven display of a display portion in various semiconductor devices, for which the TFTs are used can be suppressed.

The present invention made from the above structure will be described in more detail through the following embodiments.

[Embodiment 1]

In this embodiment, in order to check the effectiveness of the present invention, thermal treatment is performed using various base insulating films and a change in a stress before and after the thermal treatment is examined.

In FIG. 1A, a synthetic quartz glass substrate is applied as the substrate 10 and the base insulating film 11 is formed on the substrate 10. Four kinds of base insulating films are prepared. That is, in sample 1, a silicon oxynitride film (composition ratio: Si=32%, O=59%, N=7%, and H=2%) having a film thickness of 100 nm is laminated on a silicon oxynitride film (composition ratio: Si=32%, O=27%, N=24%, and H=17%) having a film thickness of 50 nm at 400° C. by a plasma CVD method. In sample 2, a silicon oxide film having a film thickness of 200 nm is formed at 400° C. by a LPCVD method. In sample 3, a silicon nitride film having a film thickness of 200 nm is formed at 775° C. by a LPCVD method. In sample 4, a silicon oxide film having a film thickness of 200 nm is formed at 800° C. by a LPCVD method. Here, a stress of the base insulating film 11 in each of the samples 1 to 4 before thermal treatment is measured.

Figure 15:
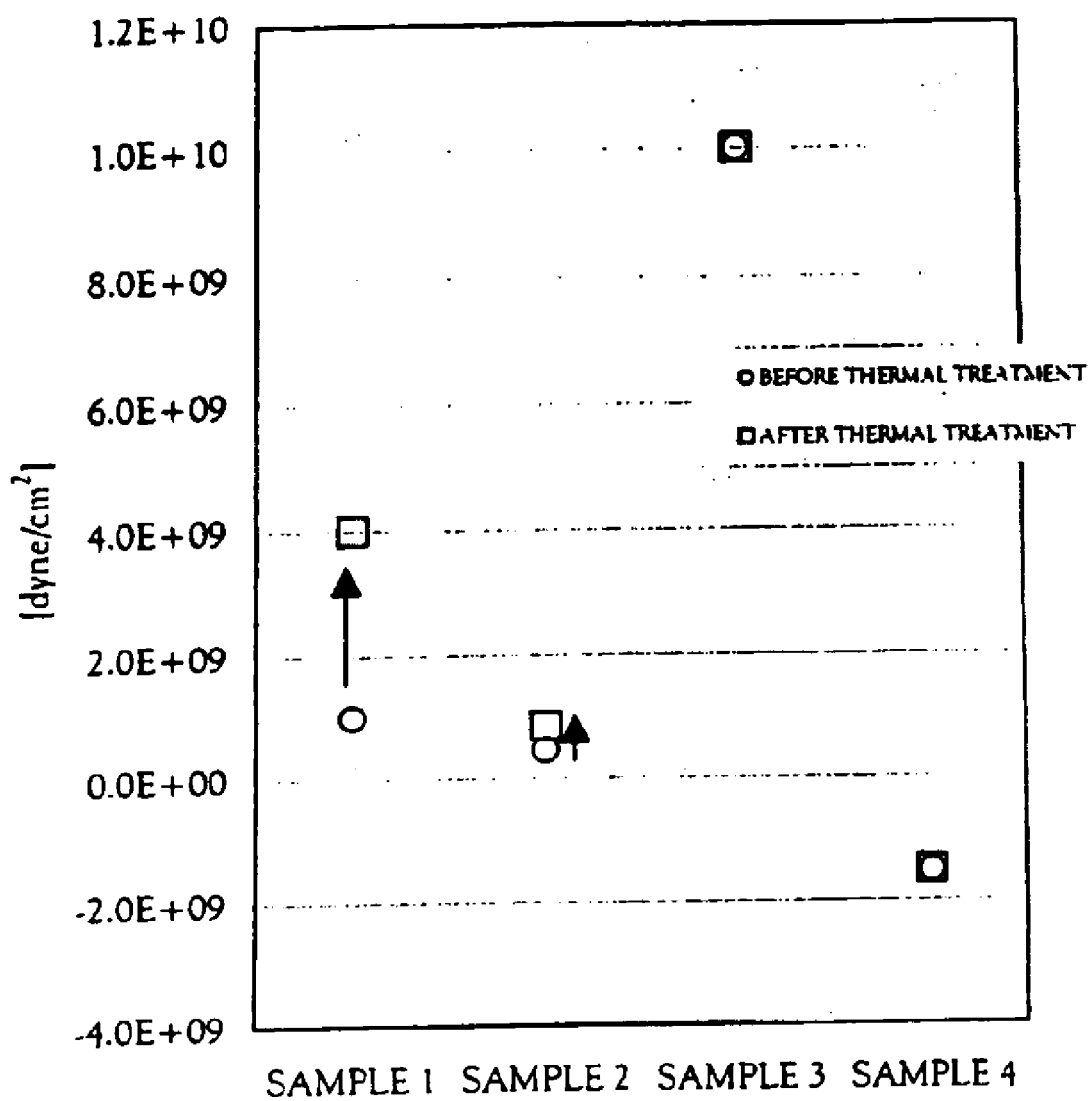
FIG. 15 shows an example of a change in a stress before and after thermal treatment of Embodiment 1.
Figure 16A:
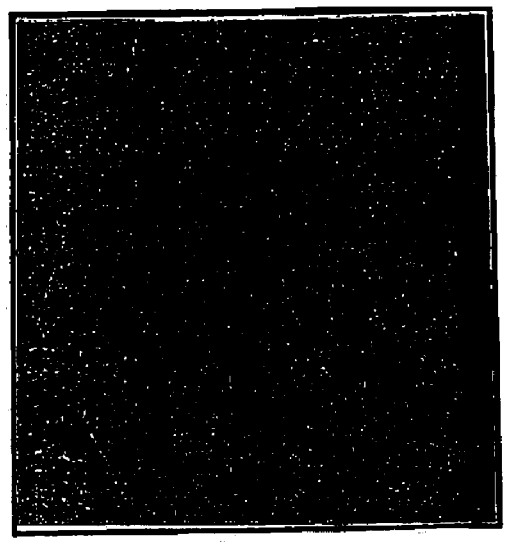
FIGS. 16A and 16B show an example of a grain produced by a crystallization method using a metallic element.
Figure 16B:
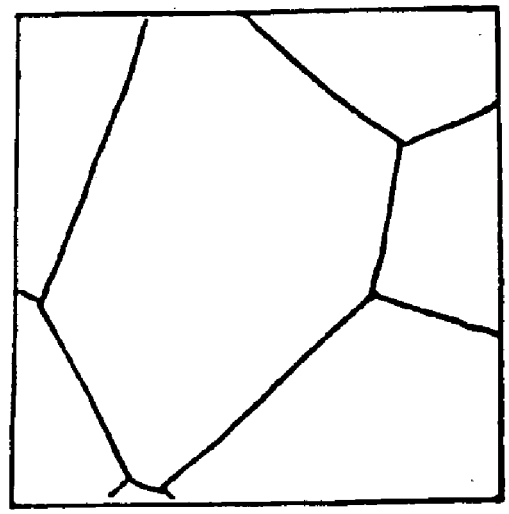
Figure 17A:
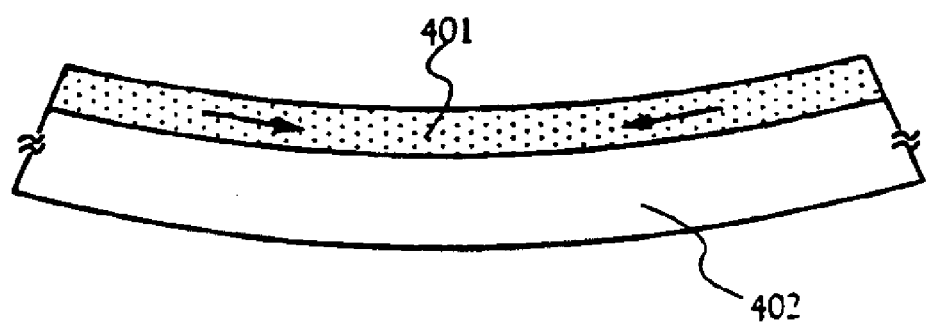
FIGS. 17A and 17B are explanatory views of a compression stress and a tensile stress.
Figure 17B:
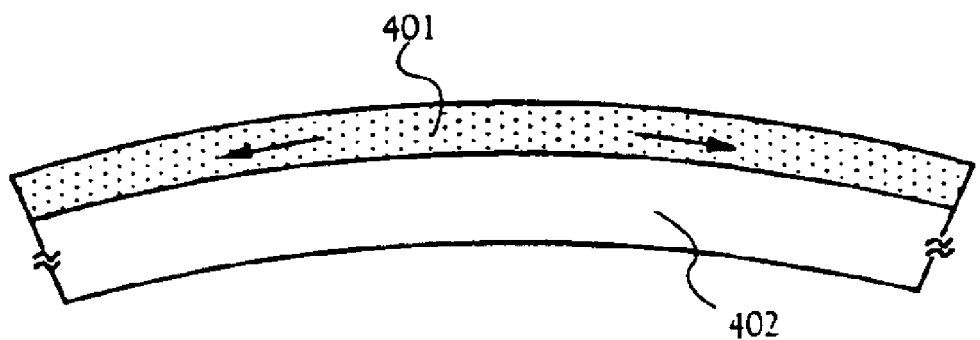

Subsequently, a furnace anneal furnace is used and thermal treatment is performed in a nitrogen atmosphere at 600° C. for 8 hours. Then, a stress of the base insulating film 11 after the thermal treatment is measured. FIG. 15 shows a chance in a stress before and after the thermal treatment. Here, symbol "−" indicates a compression stress of the base insulating film to the semiconductor film and symbol "+" indicates a tensile stress thereof.

In FIG. 15, the stress in the sample 1 is changed from $1.0 \times 10^9$ dyne/cm$^2$ to $4.0 \times 10^9$ dyne/cm$^2$. The stress in the sample 2 is changed from $4.5 \times 10^5$ dyne/cm$^2$ to $8.5 \times 10^5$ dyne/cm$^2$. The stress in the sample 3 is not changed from $1.0 \times 10^{10}$ dyne/cm$^2$. The stress in the sample 4 is not changed from $-1.5 \times 10^9$ dyne/cm$^2$. Thus, when a temperature in the thermal treatment is lower than that in the formation of the base insulating film, the stress is not changed as can be seen from FIG. 15. However, when the temperature in the thermal treatment is higher than that in the formation of the base insulating film, it is apparent that the stress is increased. In such a case, when the semiconductor film is formed on the base insulating film, it can be easily assumed that distortion is caused in the semiconductor film with increasing the stress in the base insulating film. When the distortion is caused, surface energy and a chemical potential of the semiconductor film are changed to increase a generation density of a crystal nucleus. Thus, a size of a grain to be produced is reduced.

Also, when the temperature in the thermal treatment is lower than that in the formation of the base insulating film, since the stress in the base insulating film is not changed, such a base insulating film is used as a lower layer and an insulating film in the case where the temperature in the above thermal treatment is higher than that in the formation of the base insulating film is used as an upper layer. Thus, a base insulating film having a laminate structure may be formed.

With respect to the above samples, the stress is markedly changed after the thermal treatment in the case of the sample 1 in which a silicon oxynitride film having a film thickness of 100 nm is laminated on a silicon oxynitride film having a film thickness of 50 nm at 400° C. by a plasma CVD method, and the case of the sample 2 in which a silicon oxide film having a film thickness of 200 nm is formed at 400° C. by a LPCVD method. Thus, when these samples are used as the base insulating film, it is very effective to increase a generation density of a crystal nucleus in the semiconductor film formed on the base insulating film and to make grains the same size.

In particular, a stress in a film containing nitrogen (SiNx or SiNxOy) tends to be large in a tensile stress side and a change in a stress due to thermal treatment becomes large in many cases. Thus, when a semiconductor film is formed on the film containing nitrogen and thermal treatment is performed, a generation density of a crystal nucleus can be sufficiently increased.

When TFTs are made from a thus obtained crystalline semiconductor film, the number of grains included in active regions, in particular, channel forming regions can be averaged. Also, a variation in an electrical characteristic can be reduced and uneven display of a display portion in various semiconductor devices, for which the TFTs are used can be suppressed.

[Embodiment 2]

An embodiment of another structure of the present invention will be described using cross sectional views of FIGS. 2A to 2C.

Figure 2A:
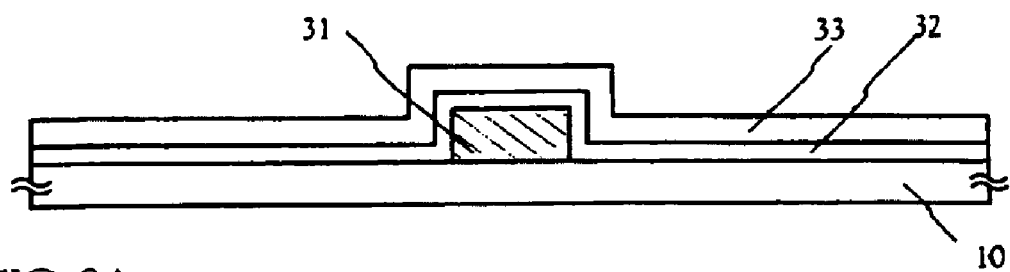
FIGS. 2A to 2C show fabrication steps of a semiconductor film of Embodiment 2.
Figure 2B:
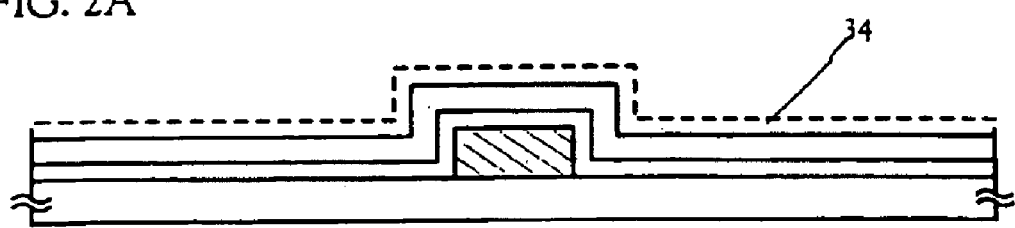
Figure 2C:
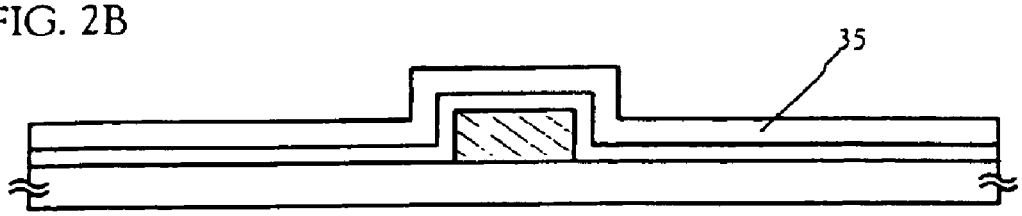

In FIG. 2A, a synthetic quartz glass substrate or a glass substrate made of no alkali glass such as barium borosilicate glass or aluminoborosilicate glass may be used as a substrate 10. For example, #7059 glass, #1737 glass, or the like which is produced by Corning corp. can be preferably used. Also, a plastic substrate having a heat resistance to a processing temperature in this embodiment mode may be used. In this embodiment, a synthetic quartz glass substrate is applied.

A conductive film is formed on the substrate 10 and etched to form a conductive layer 31 having a predetermined shape. A material of the conductive layer is not particularly limited. However, a material having a heat resistance is used and the conductive layer may be made of an element selected from the group consisting of Ta, W, Ti, Mo, Cu, Cr, and Nd, an alloy material mainly containing the element, or a compound material mainly containing the element. A semiconductor film represented by a crystalline silicon film doped with an impurity element such as phosphorus may be used. An AgPdCu alloy may be used. Of course, the conductive layer may not be a single layer and may be a laminate. In this embodiment, a W film having a film thickness of 400 nm is formed by a sputtering method and then etched to from the conductive layer 31.

Subsequently, an insulating film 32 as a silicon nitride film, a silicon oxynitride film, a silicon oxide film, or the like is formed in contact with the substrate 10 and the conductive layer 31 by a known means (LPCVD method, a plasma CVD method, or the like). In this embodiment, a silicon oxynitride film having a film thickness of 150 nm is formed as the insulating film 32 at 350° C.

Next, a semiconductor film 33 is formed on the insulating film 32 to have a thickness of 10 nm to 200 nm (preferably, 30 nm to 100 nm) by a known means such as a plasma CVD method or a sputtering method. There is an amorphous semiconductor film, a microcrystalline semiconductor film, or the like as the semiconductor film 33 and a compound semiconductor film having an amorphous structure such as an amorphous silicon germanium film may be applied. In this embodiment, a sputtering method is used and an amorphous silicon film having a film thickness of 55 nm is formed at 150° C.

After that, the semiconductor film is crystallized by a thermal crystallization method using a metallic element such as nickel. First, a layer including a metallic element for promoting crystallization (metal containing layer 34) is formed. There is nickel, palladium, lead, or the like as the metallic element. A plasma treatment method, an evaporation method, an ion implantation method, a sputtering method, a solution coating method, or the like may be used as an adding method. In this embodiment, a nickel acetate aqueous solution (weight converting concentration is 5 ppm and volume is 10 ml) is applied onto the surface of the amorphous silicon film by a spin coating to form the metal containing layer 34.

Then, thermal treatment is performed to crystallize the semiconductor film. This thermal treatment is performed by a thermal anneal method using a furnace anneal furnace. The thermal anneal method is preferably performed in a nitrogen atmosphere at an oxygen concentration of 1 ppm or lower, preferably 0.1 ppm or lower and at 400° C. to 700° C., typically 500° C. to 550° C. for about 4 hours to 12 hours. A rapid thermal anneal method (RTA method) or the like may be used as another thermal treatment in addition to the thermal anneal method. In this embodiment, thermal treatment (at 580° C. for 8 hours) is performed to form a crystalline silicon film.

Of course, the crystallization of the semiconductor film and the improvement of crystallinity can be also made by combination with a known crystallization method (laser crystallization method or the like) other than a thermal crystallization method using a metallic element.

Since the thermal treatment is performed at a higher temperature than that in the formation of the insulating film, a stress in the insulating film is increased. With this increase, distortion is caused in the semiconductor film formed on the insulating film. When the distortion is caused, surface energy and a chemical potential of the semiconductor film are changed to increase a generation density of a crystal nucleus. Thus, a size of a grain to be produced is reduced.

When TFTs are made from a thus formed crystalline semiconductor film, the number of grains included in active regions, in particular, channel forming regions can be averaged. Also, a variation in an electrical characteristic can be reduced and uneven display of a display portion in various semiconductor devices, for which the TFTs are used can be suppressed.

[Embodiment 3]

In this embodiment, a method of manufacturing an active matrix substrate will be described using FIGS. 3A to 3C to 8A and 8B. In this specification, a substrate on which a driver circuit having a CMOS circuit and a pixel portion having a pixel TFT and a storage capacitor are formed is called an active matrix substrate for convenience.

First, in this embodiment, a substrate 501 made of glass such as barium borosilicate glass (represented by #7059 glass, #1737 glass, or the like, which is produced by Corning corp.) or aluminoborosilicate glass is used. A quartz substrate or a silicon substrate may be used as the substrate 501. Also, a substrate obtained by forming an insulating film on the surface of a metallic substrate or a stainless substrate may be used. Further, a plastic substrate having a heat resistance to a processing temperature in this embodiment mode may be used. In this embodiment, a synthetic quartz glass substrate is used.

Next, a base film is formed on the quartz substrate 501 and a lower portion light shielding film is formed on the base film. First, a base film 502 made from an insulating film such as a silicon oxide film, a silicon nitride film, or a silicon oxynitride film is formed to have a film thickness of 10 nm to 150 nm (preferably, 50 nm to 100 nm). Then, a lower portion light shielding film which is made of a conductive material such as Ta, W, Cr, or Mo, resistant to a processing temperature in this embodiment and has a laminate structure thereof is formed to have a film thickness of about 300 nm. The lower portion light shielding film also functions as a gate wiring. In this embodiment, a crystalline silicon film having a film thickness of 75 nm is formed and subsequently a WSix (x=2.0 to 2.8) film having a film thickness of 150 nm is formed, and then an necessary portion is etched to form a lower portion light shielding film 503. Note that in this embodiment, a single layer structure is used for the lower portion light shielding film 503. However, a laminate may be used. Also, even in the case of the base film, a structure in which insulating films of two layers or more are laminated may be used.

Then, a base film 504 which is made from an insulating film such as a silicon oxide film, a silicon nitride film, or a silicon oxynitride film and has a film thickness of 10 nm to 650 nm (preferably, 50 nm to 600 nm) is formed on the substrate 501 and the lower portion light shielding film 503. In this embodiment, a single layer structure is used for the base film 504. However, a structure in which insulating films of two layers or more are laminated may be used. In this embodiment, a silicon oxynitride film 504 (composition ratio: Si=32%, O=27%, N=24%, and H=17%) having a film thickness of 580 nm is formed as the base film 504 at 350° C. by a plasma CVD method using $SiH_4$, $NH_3$, and $N_2O$ as reactive gases.

Then, a semiconductor film 505 is formed on the base film 504. The semiconductor film 505 is obtained by forming a semiconductor film having an amorphous structure to have a thickness of 10 nm to 300 nm, preferably, 25 nm to 80 nm (typically, 30 nm to 60 nm) by a known means (sputtering method, an LPCVD method, a plasma CVD method, or the like). A material of the semiconductor film is not particularly limited. However, the semiconductor film is preferably made of silicon, a silicon germanium (SiGe) alloy, or the like. In this embodiment, an amorphous silicon film having a film thickness of 55 nm is formed at 465° C. by an LPCVD method (FIG. 3A).

Then, a thermal crystallization method using a catalyst such as nickel is performed to crystallize the semiconductor film. In addition to the thermal crystallization method using a catalyst such as nickel, known crystallization processes (laser crystallization method, a thermal crystallization method, and the like) may be performed by a combination thereof. In this embodiment, a nickel acetate solution (weight converting concentration is 10 ppm and volume is 5 ml) is applied onto the entire surface of the film by a spin coating to form a metal containing layer 405 and it is exposed to a nitrogen atmosphere at a temperature of 600° C. for 12 hours (FIG. 3B).

When a laser crystallization method is also applied, a solid laser, a gas laser, or a metallic laser, which is a pulse oscillation type or a continuous light emitting type, is desirably used. Note that there is a YAG laser, a $YVO_4$ laser, a YLF laser, a $YAlO_3$ laser, a glass laser, a ruby laser, an alexandrite laser, a Ti: sapphire laser, or the like, which is a pulse oscillation type or a continuous light emitting type, as the solid laser. Also, there is an excimer laser, an Ar laser, a Kr laser, a $CO_2$ laser, or the like, which is a pulse oscillation type or a continuous light emitting type, as the gas laser. Further, there is a helium cadmium laser, a copper vapor lasers and a gold vapor laser, which is a pulse oscillation type or a continuous light emitting type, as the metallic laser. When these lasers are used, a method of linearly condensing a laser beam emitted from a laser oscillator by an optical system and irradiating it to the semiconductor film is preferably used. A crystallization condition is selected appropriately by an executor. When an excimer laser is used, a pulse oscillation frequency is set to be 300 Hz and a laser energy density is set to be 100 $mJ/cm^2$ to 1500 $mJ/cm^2$, preferably, 100 $mJ/cm^2$ to 800 $mJ/cm^2$ (typically, 200 $mJ/cm^2$ to 700 $mJ/cm^2$). When a YAG laser is used, it is preferable that the second harmonic is used, a pulse oscillation frequency is set to be 1 Hz to 300 Hz and a laser energy density is set to be 100 $mJ/cm^2$ to 1500 $mJ/cm^2$, preferably, 300 $mJ/cm^2$ to 1000 $mJ/cm^2$ (typically, 350 $mJ/cm^2$ to 800 $mJ/cm^2$). A laser beam linearly condensed at a width of 100 μm to 1000 μm, for example, 400 μm is irradiated over the entire surface of the substrate. At this time, an overlap ratio of the linear laser beam may be set to be 50% to 98%. When a continuous oscillation type laser is used, an energy density of about 0.01 $MW/cm^2$ to 100 $MW/cm^2$ (preferably, 0.1 $MW/cm^2$ to 10 $MW/cm^2$) is required. It is preferable that a stage is moved relatively to laser light at a speed of about 0.5 cm/s to 2000 cm/s and laser light is irradiated thereto to form a crystalline silicon film.

Of course, TFTs can be also made from a first crystalline semiconductor film obtained by a thermal crystallization method using a catalyst such as nickel. However, since crystallinity of a second crystalline semiconductor film obtained by a laser crystallization method is improved, an electrical characteristic of a TFT is improved. Thus, it is desirable the second crystalline semiconductor film is used. For example, when an n-channel TFT is made from the first crystalline semiconductor film, the mobility is about 300 $cm^2/Vs$. However, when an n-channel TFT is made from the second crystalline semiconductor film, the mobility becomes about 500 $cm^2/Vs$ to 600 $cm^2/Vs$ and is markedly increased.

Thus, when the processing is performed at a higher temperature than that in the formation of the base insulating film and the semiconductor film, the stress of the base insulating film is increased and distortion is caused in the semiconductor film with this increase. Therefore, a generation density of a crystal nucleus is increased and a crystalline semiconductor film having a grain with a small size can be formed.

Subsequently, gettering is performed to remove or reduce a metallic element used for promoting crystallization from the semiconductor layer as an active region (FIG. 3C). With respect the gettering, the method disclosed in Japanese Patent Application Laid-open No. Hei 10-270363 is preferably used. In this embodiment, a silicon oxide film having a film thickness of 50 nm is formed as a mask and patterned to obtain silicon oxide films 506a to 506d having desired shapes. Then, P (phosphorus) is selectively implanted into the semiconductor film and thermal treatment is performed. Thus, the metallic element can be removed from the semiconductor layer or can be reduced to such an extent that a semiconductor characteristic is not influenced. In the case of a TFT having the active region thus formed, an off current value is reduced and crystallinity is preferable. Therefore, high field effect mobility is obtained and a preferable characteristic can be achieved.

Then, the crystalline semiconductor film is etched to form semiconductor layers 507a to 510a.

Next, the masks 506a to 506d are removed and new insulting film 511a is formed. In order to improve crystallinity of the semiconductor film, it is desirable that thermal treatment is performed to thermally oxidize the upper portion of the semiconductor film. In this embodiment, a silicon oxide film having a thickness of 20 nm is formed by a low pressure CVD apparatus and then thermal treatment is performed in a furnace anneal furnace (FIG. 4A). The upper portions of the semiconductor layers 507a to 510a are oxidized by this treatment. Then, when the silicon oxide film and the oxidized portions of the semiconductor layers are etched, semiconductor layers 507b to 510b having improved crystallinity are obtained.

After the semiconductor layers 507b to 510b are formed, a minute amount of impurity element (boron or phosphorus) may be doped to control a threshold value of a TFT.

Next, a first gate insulating film 511b covering the semiconductor layers 507b to 510b is formed. An insulating film including silicon is formed as the first gate insulating film 511b to have a thickness of 20 nm to 150 nm by a plasma CVD method or a sputtering method (FIG. 4B). In this embodiment, a silicon oxynitride film (composition ratio: Si=32%, O=59%, N=7%, and H=2%) is formed to have a thickness of 35 nm by a plasma CVD method. Of course, the gate insulating film is not limited to the silicon oxynitride film and another insulating film including silicon may be used.

Also, when a silicon oxide film is used, TEOS (tetraethyl orthosilicate) and $O_2$ are mixed by a plasma CVD method, a reaction pressure is set to be 40 Pa, and a substrate temperature is set to be 300° C. to 400° C. Then, discharge is produced at a high frequency (13.56 MHz) power density of 0.5 $W/cm^2$ to 0.8 $W/cm^2$. Thus, the silicon oxide film can be formed. After that, when thermal annealing is performed for the thus formed silicon oxide film at 400° C. to 500° C., a preferable characteristic as to the gate insulating film can be obtained.

Then, the gate insulating film is partially etched to expose the semiconductor layer 510b as one electrode of a storage capacitor and an impurity element is introduced into the semiconductor layer 510b (FIG. 4C). At this time, since resists 513 (513a and 513b) are formed in other regions, the impurity element is not introduced therein. In this embodiment, doping processing is performed using P (phosphorus) as the impurity element at an accelerating voltage of 10 keV in a dose of $5 \times 10^{14}/cm^2$. Thus, an impurity region 514 is formed.

Subsequently, the resists 513 (513a and 513b) are removed and a second (gate insulating film 512 is formed.

An insulating film including silicon is formed as the second gate insulating film 512 to have a thickness of 20 nm to 150 nm by a plasma CVD method or a sputtering method. In this embodiment, a silicon oxynitride film (composition ratio: Si=32%, O=59%, N=7%, and H=2%) is formed to have a thickness of 50 nm by a plasma CVD method. Of course, the gate insulating film is not limited to the silicon oxynitride film and another insulating film including silicon may be used.

A contact connected with the light shielding film of the lower portion is formed and then a first conductive film 515 having a film thickness of 20 nm to 100 nm and a second conductive film 516 having a film thickness of 100 nm to 400 nm are laminated (FIG. 4D). In this embodiment, the first conductive film 515 made from a TaN film having a film thickness of 30 nm and the second conductive film 516 made of a W film having a film thickness of 370 nm are laminated. The TaN film is formed by a sputtering method using Ta as a target in an atmosphere containing nitrogen. Also, the W film is formed by a sputtering method using W as a target. In addition, it can be formed by a thermal CVD method using tungsten hexafluoride ($WF_6$). In any case, when these films are used for a gate electrode, it is necessary to reduce the resistance and resistivity of the W film is desirably made to be 20 $\mu\Omega$cm or lower. When a crystal grain is enlarged, the resistivity of the W film can be reduced. However, if a large number of impurity elements such as oxygen are present in the W film, crystallization is hindered and the resistance is increased. Therefore, in this embodiment, the W film is formed by a sputtering method using high purity W (purity of 99.9999%) as a target after due consideration such that an impurity does not enter from a gas phase at film formation. Thus the resistivity of 9 $\mu\Omega$cm to 20 $\mu\Omega$cm can be realized.

Note that, in this embodiment, TaN is used for the first conductive film 515 and W is sued for the second conductive film 516. However, the present invention is not particularly limited to these materials and respective conductive films may be made of an element selected from the group consisting of Ta, W, Ti, Mo, Al, Cu, Cr, and Nd, an alloy material including mainly the element, or a compound material including mainly the element. A semiconductor film represented by a crystalline silicon film doped with an impurity element such as phosphorus may be also used. An AgPdCu alloy may be also used. There are a combination in which the first conductive film is made from a tantalum (Ta) film and the second conductive film is made from a W film, a combination in which the first conductive film is made from a titanium nitride (TiN) film and the second conductive film is made from a W film, a combination in which the first conductive film is made from a tantalum nitride (TaN) film and the second conductive film is made from an Al film, and a combination in which the first conductive film is made from a tantalum nitride (TaN) film and the second conductive film is made from a Cu film.

Next, masks made of resists (not shown) are formed by a photolithography method and etching processing for forming electrodes and wirings is performed. In this embodiment, with respect to an etching condition, an ICP (inductively coupled plasma) etching method is used, $CF_4$, $Cl_2$, and $O_2$ are used as etching gases, and a ratio of respective gas flow rates is set to be 25:25:10 (sccm). RF power having 500 W and 13.56 MHz is supplied to a coil type electrode at a pressure of 1 Pa to produce plasma for etching. Here, a dry etching apparatus (Model E645-☐ICP) using ICP, which is produced by Matsushita Electronic Industrial Co., Ltd. is used. Also, RF power having 150 W and 13.56 MHz is supplied to a substrate side (sample stage) to apply a substantially negative self bias voltage.

Figure 5A:
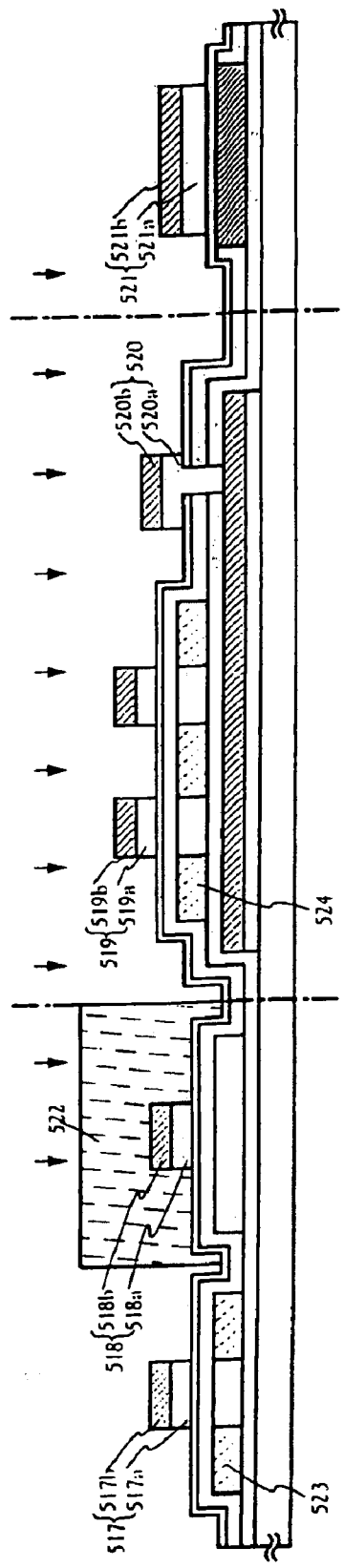
FIGS. 5A to 5C are cross sectional views indicating steps of manufacturing the pixel TFTs and the TFTs of the driver circuit of Embodiment 3.

Then, third doping processing is performed to introduce an impurity element for providing an n-type to the semiconductor layers (FIG. 5A). The doping processing is preferably performed by an ion doping method or an ion implantation method. With respect to a condition of the ion doping method, a dose is set to be $1\times10^{13}/cm^2$ to $5\times10^{14}/cm^2$ and an accelerating voltage is set to be 30 keV to 80 keV. In this embodiment, a dose is set to be $1.5\times10^{13}/cm^2$ and an accelerating voltage is set to be 60 keV. An element belonging to group 15, typically, phosphorus (P) or arsenic (As) is used as the impurity element for providing an n-type. Here, phosphorus (P) is used. In this case, since conductive layers 517 to 521 (the first conductive films 517a to 521a and the second conductive films 517b to 521b) become masks to the impurity element for providing an n-type, low concentration impurity regions 523 and 524 are formed in a self alignment manner. The impurity element for providing an n-type is added to the low concentration impurity regions 523 and 524 at a concentration range of $1\times10^{18}/cm^3$ to $1\times10^{20}/cm^3$. Here, since a mask 522 made of a resist is formed on the semiconductor layer composing a p-channel TFT, the impurity element for providing an n-type is not introduced therein.

Figure 5B:
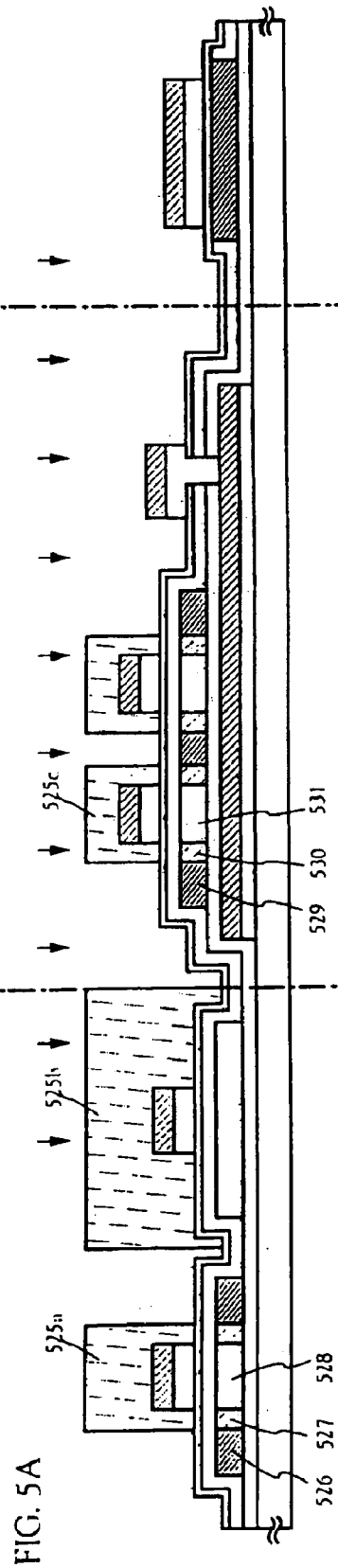

Next, the mask made of a resist is removed, a new mask is formed, and fourth doping processing to introduce the n-type impurity element is performed as shown in FIG. 5B. With respect to a condition of an ion doping method, a dose is set to be $1\times10^{13}/cm^2$ to $1\times10^{15}/cm^2$ and an accelerating voltage is set to be 30 keV to 120 keV. At this time, a mask 525b is formed so as not to introduce an impurity element for providing an n-type to the semiconductor layer composing the p-channel TFT. Also, in order to selectively form high concentration impurity regions in the semiconductor layers composing n-channel TFTs, masks 525a and 525c are formed. In this embodiment, a dose is set to be $2\times10^{15}/cm^2$ and an accelerating voltage is set to be 50 keV. Thus, high concentration impurity regions 526 and 529 are formed. Reference numerals 527 and 530 are low concentration impurity regions and 528 and 531 denotes regions not introduced with the impurity elements.

Figure 5C:
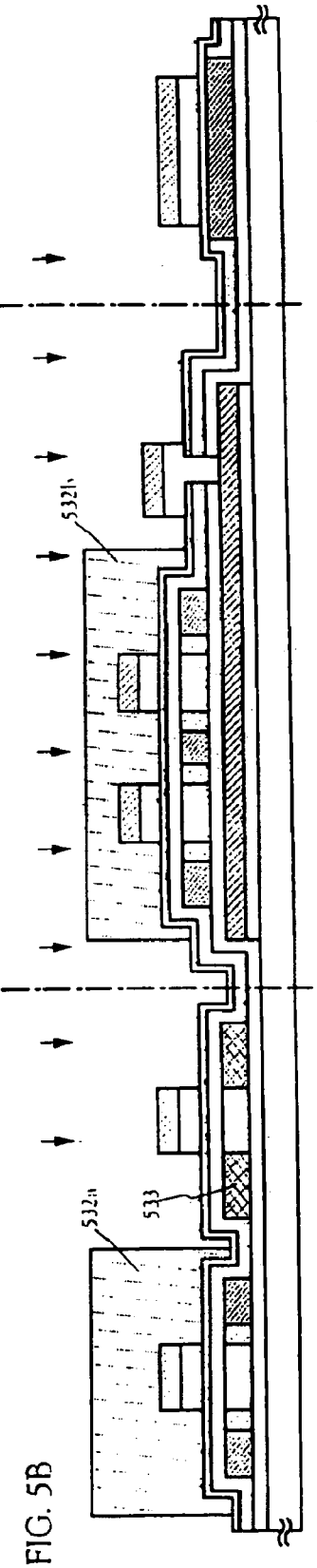

Next, the masks made of resists are removed, new masks 532a and 532b made of resists are formed, and fifth doping processing is performed as shown in FIG. 5C. By the fifth doping processing, an impurity element for providing an conductivity type opposite to the one conductivity type is added to the semiconductor layer as the active layer of the p-channel TFT. Thus, impurity regions 533 are formed. The conductive layer 518 is used as a mask to the impurity element and the impurity element for providing a p-type is added to form impurity regions in a self alignment. In this embodiment, the impurity regions 533 are formed by an ion doping method using diborane ($B_2H_6$). With respect to a condition of the ion doping method, a dose is set to be $1\times10^{13}/cm^2$ to $1\times10^{14}/cm^2$ and an accelerating voltage is set to be 30 keV to 120 keV. In the fifth doping processing, the semiconductor layers composing n-channel TFTs are covered with the masks 532a and 532b made of resists.

Next, the mask made of a resist is removed, a new mask is formed, and sixth doping processing to introduce the p-type impurity element is performed as shown in FIG. 6A. With respect to a condition of an ion doping method, a dose is set to be $1\times10^{13}/cm^2$ to $1\times10^{15}/cm^2$ and an accelerating voltage is set to be 30 keV to 120 keV. At this time, masks 534a and 534c are formed so as not to introduce an impurity element for imparting a p-type to the semiconductor layer composing the n-channel TFT. Also, in order to selectively form high concentration impurity regions in the semiconductor layers composing p-channel TFTs, a mask 534b is formed. In this embodiment, a dose is set to be $1 \times 10^{15}/cm^2$ and an accelerating voltage is set to be 40 keV. Thus, high concentration impurity region 535 is formed. Reference numeral 536 is a low concentration impurity region and 537 denotes a region not introduced with the impurity elements.

By the steps until now, the high concentration impurity region and the low concentration impurity regions are formed in the respective semiconductor layers.

Next, the masks 534 made of resists are removed and a first interlayer insulating film 538 is formed. An insulating film including silicon is formed as the first interlayer insulating film 538 to have a thickness of 100 nm to 200 nm by a plasma CVD method or a sputtering method. In this embodiment, a silicon oxynitride film is formed to have a film thickness of 150 nm by a plasma CVD method. Of course, the first interlayer insulating film 538 is not limited to the silicon oxynitride film and another insulating film including silicon may be used as a single layer or a laminate structure.

Next, as shown in FIG. 6B, thermal treatment is performed for recover, of crystallinity of the semiconductor layers and activation of the impurity element added to the respective semiconductor layers. The thermal treatment is performed by a thermal anneal method using a furnace anneal furnace. The thermal anneal method is preferably performed in a nitrogen atmosphere at an oxygen concentration of 1 ppm or lower, preferably 0.1 ppm or lower and 400° C. to 700° C., typically 500° C. to 550° C. In this embodiment, activation processing is performed by thermal treatment at 550° C. for 4 hours. Note that, in addition to the thermal anneal method, a laser anneal method or a rapid thermal anneal method (RTA method) can be applied.

A solid laser, a gas laser, or a metal laser, which is a continuous light emitting type or a pulse oscillation type is desirably used as a laser for laser activation. When a continuous light emitting laser is used, an energy density of about 0.01 MW/$cm^2$ to 100 MW/$cm^2$ (preferably, 0.01 MW/$cm^2$ to 10 MW/$cm^2$) is required for laser light. A substrate is moved relatively to laser light at a speed of 0.5 cm/s to 2000 cm/s. Also, when a pulse oscillation laser is used, it is desirable that a frequency is set to be 300 Hz and a laser energy density is set to be 50 mJ/$cm^2$ to 1000 mJ/$cm^2$ (typically, 50 mJ/$cm^2$ to 700 mJ/$cm^2$). At this time, 50% to 98% of laser light may be overlapped.

Also, thermal treatment may be performed before the first interlayer insulating film is formed. However, when a used wiring material is sensitive to heat, it is preferable that thermal treatment is performed after an interlayer insulating film (insulating film containing mainly silicon, for example, a silicon nitride film) is formed, in order to protect wirings and the like as in this embodiment.

Then, when thermal treatment (at 300° C. to 550° C. for 1 to 12 hours) is performed, hydrogenation can be made. This step is a step of terminating dangling bonds of the semiconductor layers by hydrogen included in the first interlayer insulating film 538. Of course, the semiconductor layers can be also hydrogenated irrespective of the presence of the first interlayer insulating film 538. Plasma hydrogenation (using hydrogen excited by plasma) or thermal treatment in an atmosphere including hydrogen at 3% to 100% at 300° C. to 450° C. for 1 to 12 hours may be performed as another hydrogenation means.

Next, a second interlayer insulating film 539 made of an inorganic insulating film material or an organic insulator material is formed on the first interlayer insulating film 538. In this embodiment, a silicon oxynitride film having a film thickness of 1 $\mu$m is formed.

Then, wirings 540 to 542 electrically connected with respective impurity regions are formed in a driver circuit 555. Also, source wirings 543 and 545 and a drain electrode 544 are formed in a pixel portion 556 (FIG. 6C). Note that these wirings are formed by patterning a laminate film of a Ti film having a film thickness of 50 nm and an alloy film (alloy film of Al and Ti) having a film thickness of 500 nm.

Figure 7:
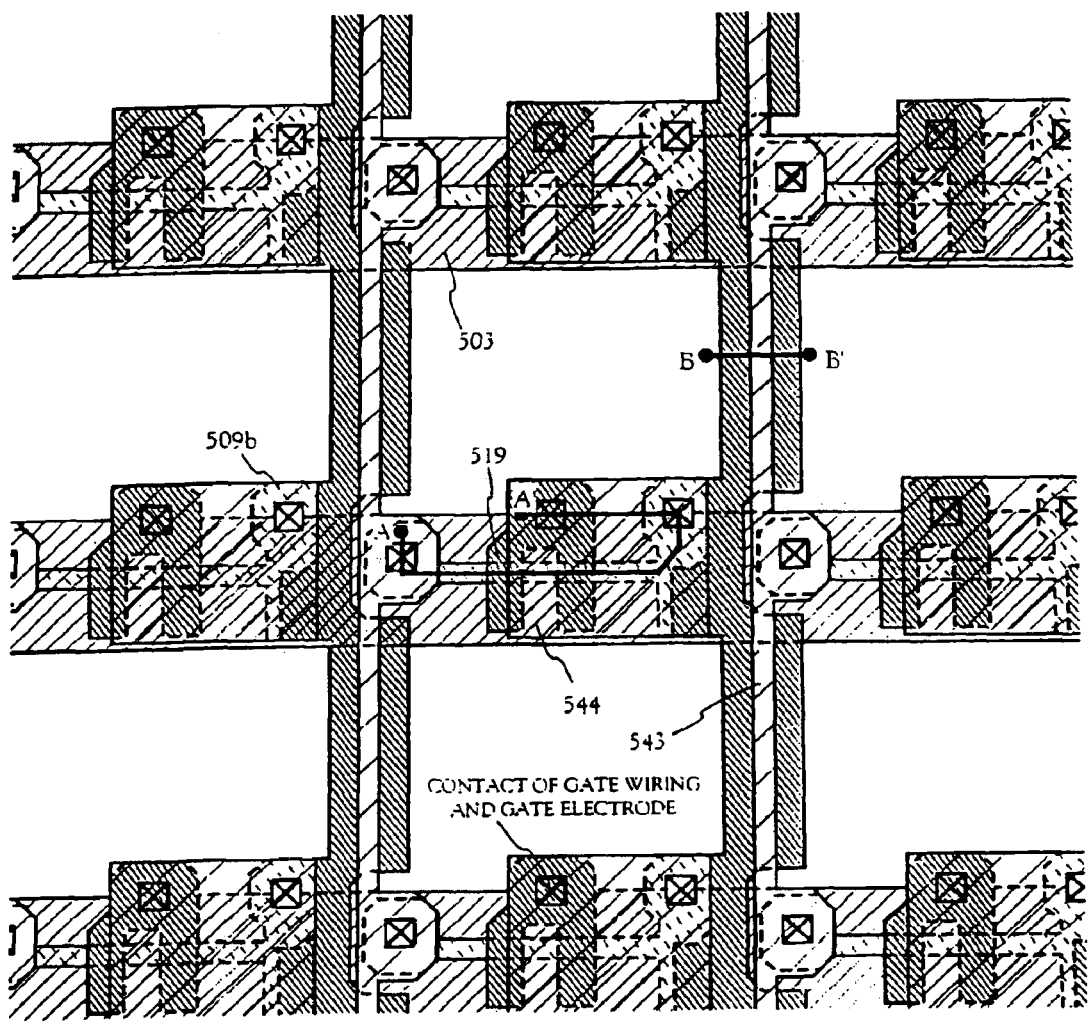
FIG. 7 is a top view indicating structures of the pixel TFTs of Embodiment 3.

FIG. 7 is a top view showing a state of the substrate manufactured until now. Note that the same reference numerals are used for the portions corresponding to those in FIGS. 3A to 3C to 6A to 6C. A chain line A–A' in FIG. 6C corresponds to a cross sectional view obtained by cutting along a chain line A–A' in FIG. 7. Also, a chain line B–B' in FIG. 6C corresponds to a cross sectional view obtained by cutting along the chain line B–B' in FIG. 7.

Next, a third interlayer insulating film 560 made of an inorganic insulating film material or an organic insulator material is formed on the second interlayer insulating film 539. In this embodiment, a silicon oxynitride film having a film thickness of 1.8 $\mu$m is formed.

Figure 8A:
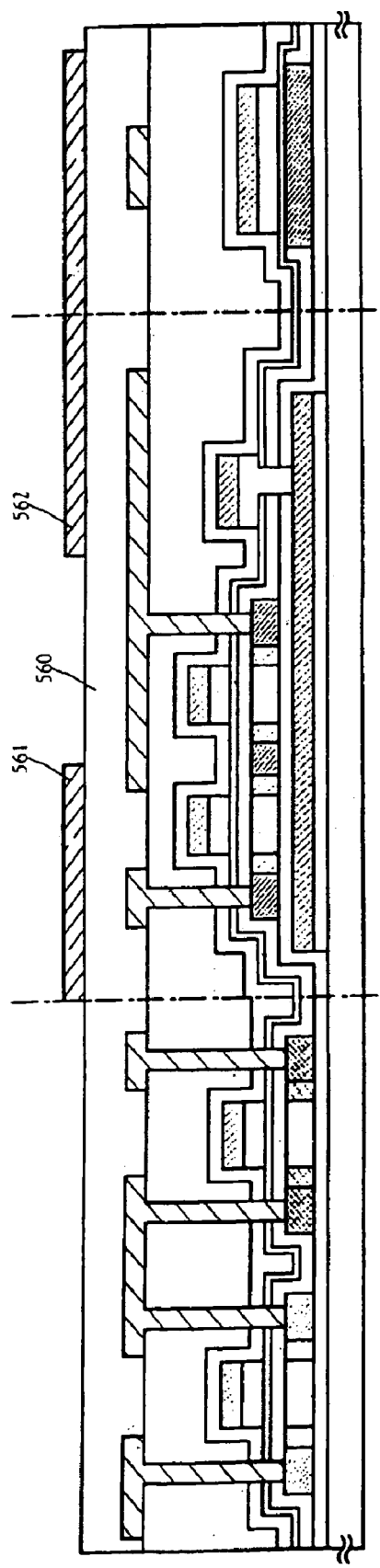
FIGS. 8A and 8B are cross sectional views indicating steps of manufacturing the pixel TFTs and the TFTs of the driver circuit of Embodiment 3.

A film which is made of Al, Ti, W, Cr, a black resin, or the like and has a high light shielding property is formed on the third interlayer insulating film 539 and patterned in a desired shape to form light shielding films 561 and 562. The light shielding films 561 and 562 are located in mesh so as to light-shield portions except openings of pixels (FIG. 8A).

Figure 8B:
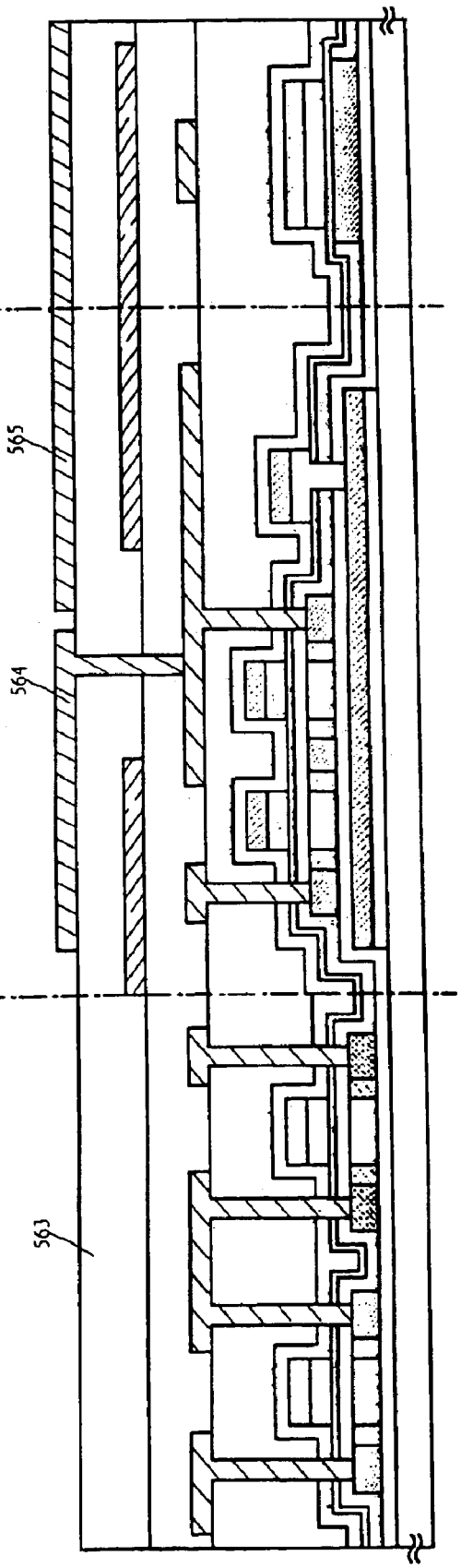

Further, a fourth interlayer insulating film 563 made of an inorganic insulating material is formed so as to cover the light shielding films 561 and 562. Then, a contact hole which reaches the connection wiring 544 is formed. After that, a transparent conductive film made of ITO or the like is formed to have a thickness of 100 nm and patterned in a desired shape to form pixel electrodes 564 and 565 (FIG. 8B).

Thus, a driver circuit 555 having an n-channel TFT 551 and a p-channel TFT 552, and a pixel portion 556 having a pixel TFT 553 and a storage capacitor 554 can be formed on the same substrate. Therefore, the active matrix substrate is completed.

With respect to the TFTs in the thus manufactured active matrix substrate, the number of grains to be included in the active regions, in particular, the channel forming regions is averaged. Therefore, a variation in an electrical characteristic can be reduced and uneven display of a display portion in various semiconductor devices, for which the TFTs are used can be suppressed.

Note that this embodiment can be freely combined with Embodiment 1 or Embodiment 2.

[Embodiment 4]

In this embodiment, various semiconductor film forming methods are used for obtaining grains having different sizes and then TFTs are manufactured. Relationships between sizes of grains and electrical characteristics of TFTs are examined.

A base insulating film is formed in accordance with Embodiment 3. Subsequently, three kinds of samples are prepared. That is, measured by EBSP, in sample A, an amorphous silicon film having a film thickness of 53 nm is formed by an LPCVD (low pressure CVD) method. In sample B, an amorphous silicon film having a film thickness of 53 nm is formed by an LPCVD method and plasma processing using Ar is performed for 5 minutes. In sample C, an amorphous silicon film having a film thickness of 55 nm is formed by a PCVD (plasma CVD) method. Then, crystallization using a metallic element is made for the respective samples to obtain crystalline silicon films. Film thicknesses of these amorphous silicon films are different from each other. However, when the crystallization is made, the film thickness becomes 50 nm in any sample. Sizes of grains in the respective crystalline silicon films are 100 $\mu$m in sample A, 5 $\mu$m in sample B, and 2 $\mu$m in sample C. Steps following the crystallization step are performed in accordance with Embodiment 3 to manufacture TFTs.

Figure 18A:
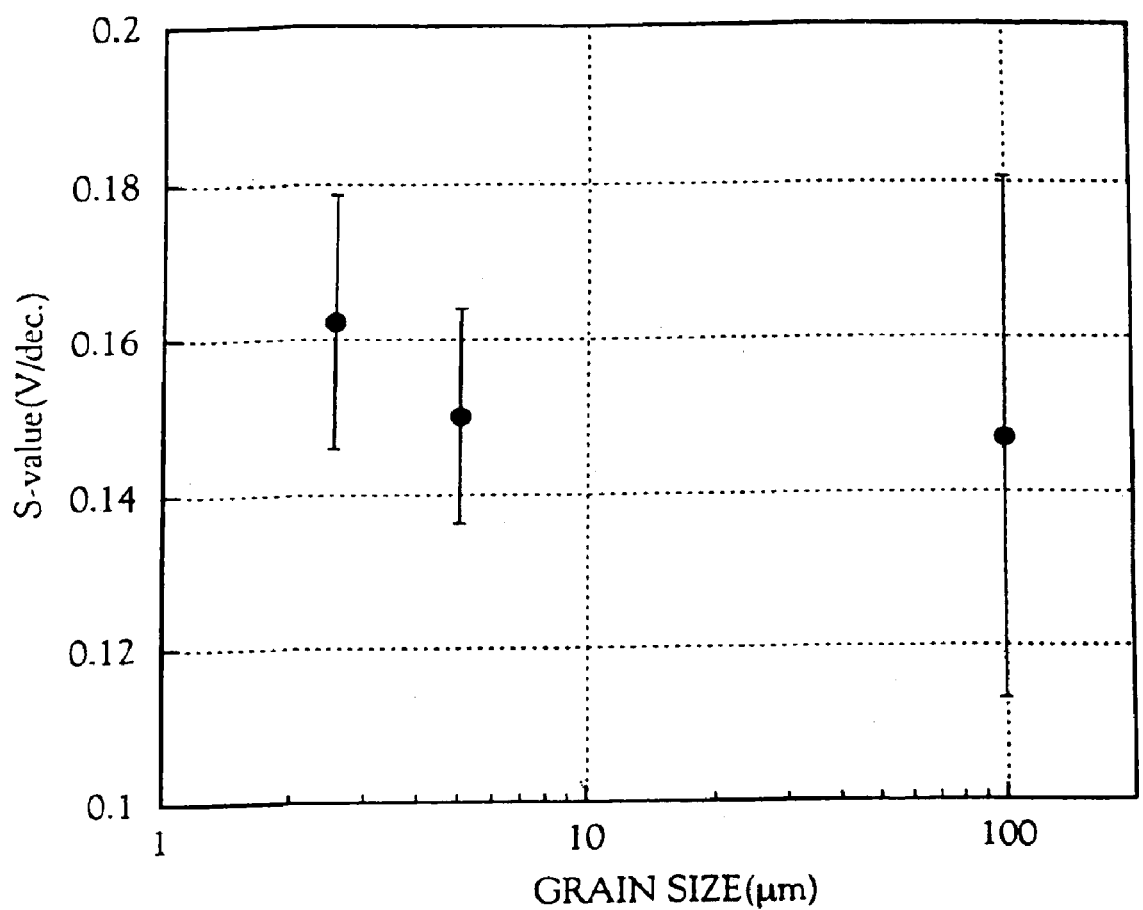
FIG. 18A shows an example of a relationship between a size of a grain and an S value and FIG. 18B shows an example of a relationship between a size of a grain and mobility of Embodiment 4.
Figure 18B:
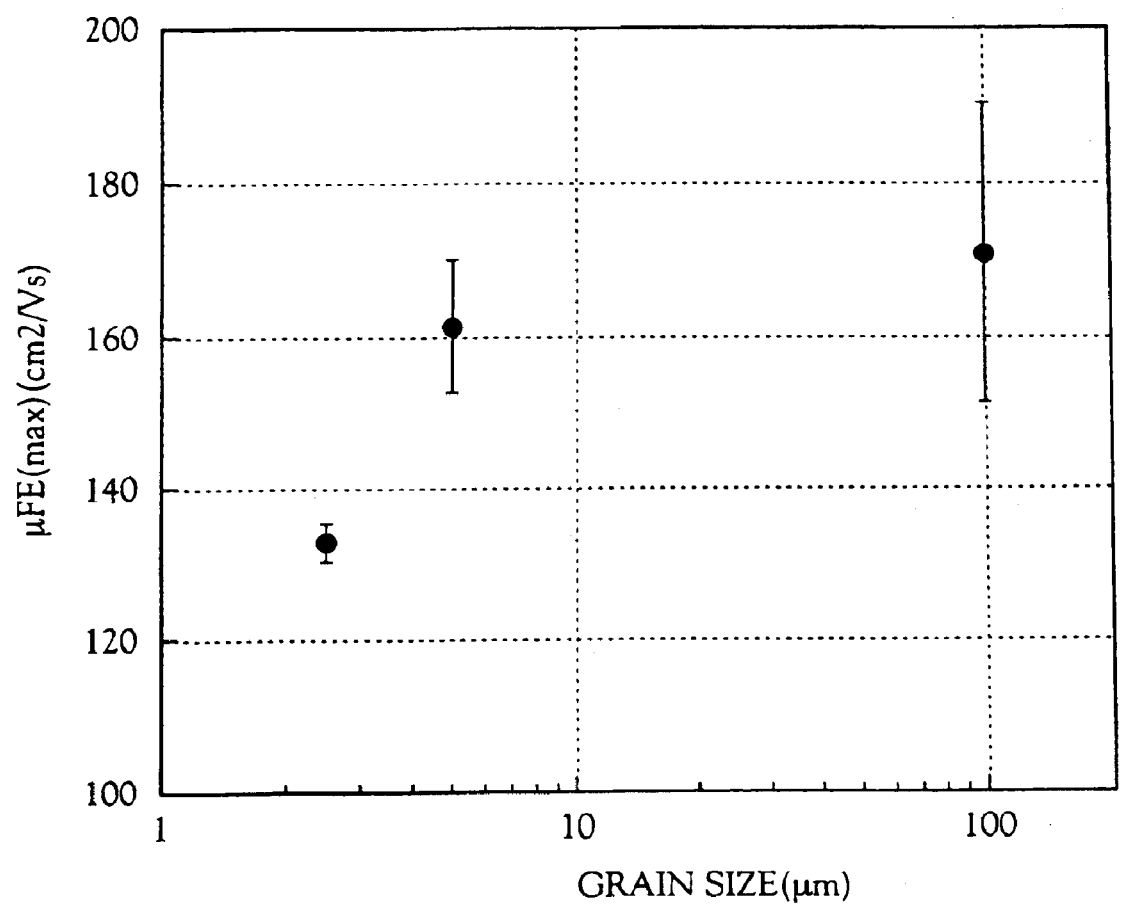

FIG. 18A shows a relationship between a size of grain and an S value and FIG. 18B shows a relationship between a size of grain and field effect mobility. In this time, an S value and field effect mobility in an n-channel TFT in which a length of a channel forming region of the TFT and a width thereof are 50/50 ($\mu$m) are measured. It is apparent from FIGS. 18A and 18B that variations in the respective characteristics are reduced with decreasing a grain size.

In the pixel portion, a TFT in which an off current value (value of a drain current flowing when the TFT is in an off-state) is low and a variation in an electrical characteristic is small is particularly required. Also, a TFT in which a variation in an electrical characteristic is small is desirable because uneven display is reduced in the case where a semiconductor device is manufactured. Of course, even in the driver circuit portion, a TFT in which a variation in an electrical characteristic is small during the operation is desirable. Thus, it is apparent that an application of the present invention is extremely effective.

Note that, in this embodiment, the generation density of the crystal nucleus is increased by the method different from the present invention to reduce the size of the gain. However, even in the present invention, the generation density of the crystal nucleus is increased to reduce the size of the gain in a similar manner. Thus, even if the size of the grain is reduced by the application of the present invention, since similar data is obtained, the effectiveness of the present invention is clear.

[Embodiment 5]

Figure 9:
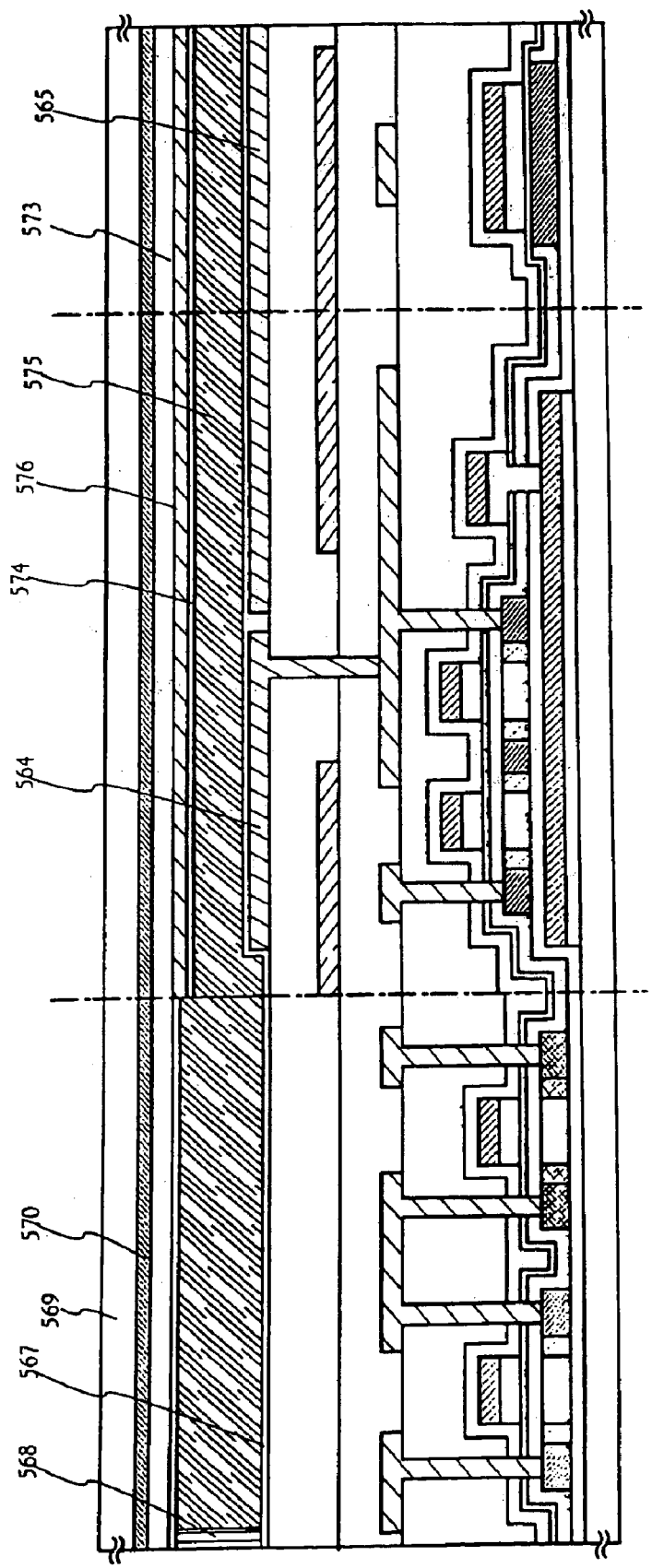
FIG. 9 is a cross sectional view indicating a step of manufacturing an active matrix liquid crystal display device of Embodiment 5.

In this embodiment, steps of manufacturing a reflection type liquid crystal display device from the active matrix substrate manufactured in Embodiment 3 will be described below. FIG. 9 is used for the description.

First, the active matrix substrate with the state as shown in FIG. 8B is obtained in accordance with Embodiment 3. After that, an orientation film 567 is formed on the active matrix substrate shown in FIG. 9, at least on the pixel electrodes 564 and 565 and rubbing processing is performed. Note that, in this embodiment, an organic resin film such as acrylic resin film is patterned before the formation of the orientation film 567 to form column-shaped spacers for keeping a substrate interval in predetermined positions. Also, instead of the column-shaped spacers, sphere-shaped spacers may be sprayed on the entire surface of the substrate.

Next, an opposite substrate 569 is prepared. Then, a colored layer 570 and a leveling film 573 are formed on the opposite substrate 569.

Next, an opposite electrode 576 made from a transparent conductive film is formed on the leveling film 573 in at least the pixel portion. An orientation film 574 is formed on the entire surface of the opposite substrate and rubbing processing is performed.

Then, the active matrix substrate in which the pixel portion and the driver circuit are formed and the opposite substrate are bonded through a sealing member 568. The sealing member 568 is mixed with fillers. The two substrates are bonded with a uniform interval by the fillers and the column-shaped spacers. After that, a liquid crystal material 575 is injected between both substrates and complete sealing is made by a sealing agent (not shown). A known liquid crystal material is preferably used as the liquid crystal material 575. Thus, the reflection type liquid crystal display device shown in FIG. 9 is completed. Then, if necessary, the active matrix substrate or the opposite substrate is divided in a desired shape. Further, a polarizing plate (not shown) is adhered to only the counter substrate. Then, an FPC is adhered by a known technique.

The liquid crystal display panel formed as described above is manufactured using TFTs in which the number of grains to be included in the active layers, in particular, the channel forming regions is averaged. Thus, a variation in an electrical characteristic can be reduced and uneven display of a display portion in various semiconductor devices, for which the liquid crystal display panel is used can be suppressed. Note, although the manufacturing process of the reflection type liquid crystal display device is described in this embodiment, changing structures of electrodes or the like, it is possible to produce a transmission type liquid crystal display device.

Note that this embodiment can be freely combined with any one of Embodiments 1 to 3.

[Embodiment 6]

This embodiment explains an example of a light emitting device manufactured by using the present invention. The present invention is not described in this embodiment. However, the present invention is applied because the active matrix substrate formed in Embodiment 3 is used in this embodiment. In this specification, the light emitting device refers, generally, to the display panel having light emitting elements formed on a substrate sealed between the substrate and a cover member, and the display module having an IC (Integrated Circuit) mounted on the display panel. Incidentally, the light emitting element has a layer including an organic compound that electroluminescence (EL) caused is obtained by applying an electric field (light emitting layer), an anode layer and a cathode layer. Meanwhile, the electroluminescence in organic compound includes the light emission (fluorescent light) upon returning from the singlet excited state to the ground state and the light emission (phosphorous light) upon returning from the triplet excited state to the ground state, including any or both of light emission.

Incidentally, in this specification, every layer in a light emitting element formed between the anode and the cathode is defined as an organic light emitting layer. The organic light emitting layer, concretely, includes a light emitting layer, a hole injecting layer, an electron injecting layer, a hole transporting layer, an electron transporting layer and the like. Basically, the light emitting element has a structure having an anode layer, a light emitting layer and a cathode layer laminated in the order. In addition to this structure, there may be structures laminated, in order, with an anode layer, a hole injecting layer, a light emitting layer and a cathode layer, or with an anode layer, a hole injecting layer, a light emitting layer, an electron transporting layer, a cathode layer and the like.

Figure 10:
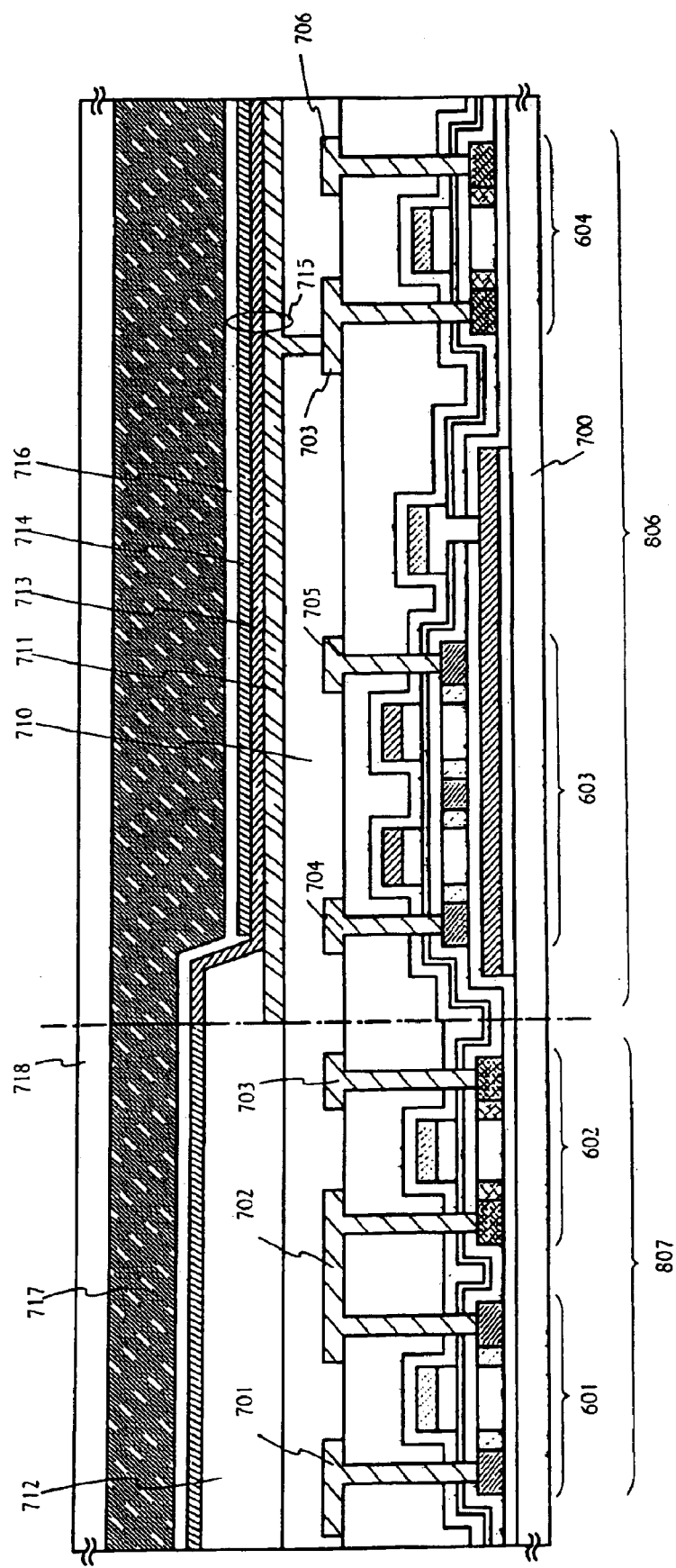
FIG. 10 is a cross sectional structural view of a driver circuit and a pixel portion in a light emitting device of Embodiment 6.

FIG. 10 is a sectional view of a light emitting device of this embodiment. In FIG. 10, the switching TFT 603 provided on the substrate is formed by using the n-channel TFT 553 of FIG. 6C. Consequently, concerning the explanation of the structure, it is satisfactory to refer the explanation on the n-channel TFT 553.

Incidentally, although this embodiment is of a double gate structure formed with two channel regions, it is possible to use a single gate structure formed with one channel region or a triple gate structure formed with three.

The driver circuit 807 provided on the substrate 700 is formed by using the CMOS circuit of FIG. 6C. Consequently, concerning the explanation of the structure, it is satisfactory to refer the explanation on the n-channel TFT 551 and p-channel TFT 552. Incidentally, although this embodiment is of a single gate structure, it is possible to use a double gate structure or a triple gate structure.

Meanwhile, the wirings 701 and 703 serve as source wirings of the CMOS circuit including the n-channel TFT 601 and the p-channel TFT 602 while the wiring 702 as a drain wiring. Meanwhile, a wiring 704 serves as a wiring to electrically connect to the source region of the switching TFT while the wiring 705 serves as a wiring to electrically connect to the drain region of the switching TFT.

Incidentally, a current control TFT 604 is formed by using the p-channel TFT 552 of FIG. 6C. Consequently, concerning the explanation of the structure, it is satisfactory to refer to the explanation on the p-channel TFT 552. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711 by being overlaid a pixel electrode 711 of the current control TFT.

Meanwhile, 711 is a pixel electrode (anode of a light emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this embodiment, it is very important to provide the planarization to the step due to the TFT by using a resin leveling film 710. A light emitting layer to be formed later, because being extremely thin, possibly causes poor light emission due to steps. Accordingly, it is desired to provide the planarization prior to forming a pixel electrode so that a light emitting layer can be formed as planar as possible.

After forming the electrode 711, a bank 712 is formed as shown in FIG. 10. The bank 712 may be formed by patterning an insulating film or organic resin film containing silicon having 100 to 400 nm.

Incidentally, because the bank 712 is an insulating film, caution must be paid to device electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1 \times 10^6$ to $1 \times 10^{12}$ Ωm (preferably $1 \times 10^8$ to $1 \times 10^{10}$ Ωm).

A light emitting layer 713 is formed on the pixel electrode 711. Incidentally, although FIG. 10 shows only one pixel, this embodiment separately forms light emitting layers correspondingly to the respective colors of R (red), G (green) and B (blue). Meanwhile, in this embodiment is formed a low molecular weight organic light emitting material by the evaporation method. Specifically, this is a lamination structure having a copper phthalocyanine (CuPc) film provided in a thickness of 20 nm as a hole injecting layer and a tris-8-qyuinolinolato aluminum complex (Alq$_3$) film provided thereon in a thickness of 70 nm as a light emitting layer. The color of emission light can be controlled by adding a fluorescent pigment, such as quinacridone, perylene or DCM1, to Alq$_3$.

However, the foregoing example is an example of organic light emitting material to be used for a light emitting layer and not necessarily limited to this. It is satisfactory to form a light emitting layer (layer for light emission and carrier movement therefore) by freely combining a light emitting layer, a charge transporting layer and an electron injecting layer. For example, although in this embodiment mode was shown the example in which a low molecular weight organic light emitting material is used for a light emitting layer, it is possible to use a middle molecular weight organic light emitting material or a high molecular weight (polymer) organic light emitting material. Incidentally, in this specification, the organic light emitting material having no sublimability but the number of molecules of 20 or less or a chained molecular length of 10 mm or smaller is considered as a middle molecular weight organic light emitting material. Meanwhile, as an example using a high molecular weight organic light emitting material, a polythiophene (PEDOT) film having 20 nm may be provided as a hole injecting layer by a spin coat technique and a paraphenylene vinylene (PPV) film having approximately 100 nm be provided thereon as a light emitting layer, to form a lamination structure. Incidentally, if a π conjugated system macromolecule of PPV is used, emission wavelength can be selected from red to blue. Meanwhile, it is possible to use an inorganic material such as silicon carbide for an electron transporting layer or charge injecting layer. These organic light emitting materials or inorganic materials can be a known material.

Next, a cathode 714 of a conductive film is provided on the light emitting layer 713. In the case of this embodiment, as the conductive film is used an alloy film of aluminum and lithium. A known MgAg film (alloy film of magnesium and silver) may be used. As the cathode material may be used a conductive film of an element belonging to the periodic table group 1 or 2, or a conductive film added with such an element.

A light emitting element 715 is completed at a time having formed up to the cathode 714. Incidentally, the light emitting element 715 herein refers to a diode formed with a pixel electrode (anode) 711, a light emitting layer 713 and a cathode 714.

It is effective to provide a passivation film 716 in such a manner to completely cover the light emitting element 715. The passivation film 716 is formed by an insulating film including a carbon film, a silicon nitride film or a silicon oxynitride film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range of from room temperature to 100° C. or less, can be easily deposited over the light emitting layer 713 low in heat resistance. Meanwhile, the DLC film, having a high blocking effect to oxygen, can suppress the light emitting layer 713 from oxidizing. Consequently, prevented is the problem of oxidation in the light emitting layer 713 during the following seal process.

Furthermore, a sealing material 717 is provided on the passivation film 716 to bond a cover member 715. For the sealing material 717 used may be an ultraviolet curing resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light emitting device having a structure as shown in FIG. 10. It is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, an n-channel TFT 601, a p-channel TFT 602, a switching TFT (n-channel TFT) 603 and a current control TFT (p-channel TFT) 604 on the substrate. The number of masks required in the manufacture process so far is less than that of a general active matrix light emitting device.

Namely, because the TFT manufacturing process is greatly simplified, it is possible to realize yield improvement and manufacture cost reduction.

Furthermore, in a case of providing an impurity region overlapped with the gate electrode through an insulating film in FIG. 10, it is possible to form an n-channel TFT resistive to the deterioration resulting from hot-carrier effect. Consequently, a reliable light emitting device can be realized.

Meanwhile, this embodiment shows only the configuration of the pixel portion and driver circuit. However, according to the manufacturing process in the embodiment, besides these, it is possible to form on the same insulating material such logic circuits as a signal division circuit, a D/A converter, an operation amplifier, a γ-correction circuit or the like. Furthermore, a memory or microprocessor can be formed.

Figure 11A:
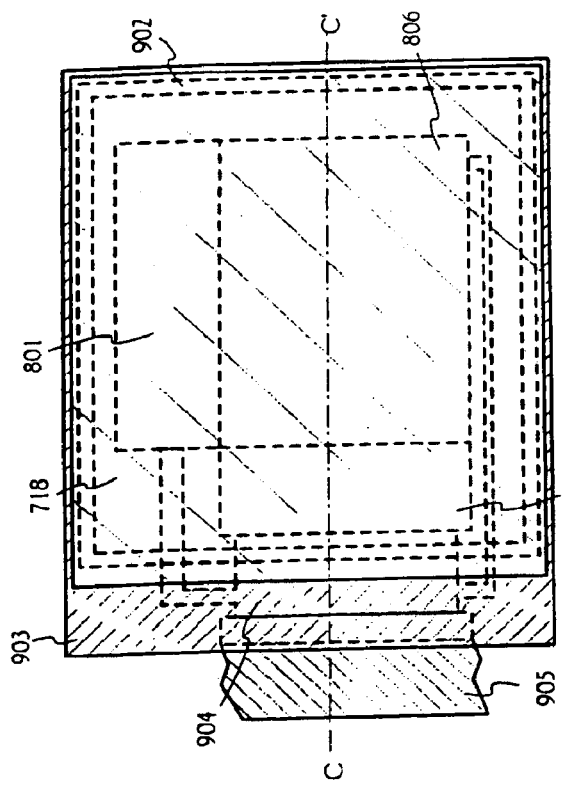
FIG. 11A is a top view of a light emitting device and FIG. 11B is a cross sectional structural view of a driver circuit and a pixel portion in the light emitting device of Embodiment 6.
Figure 11B:
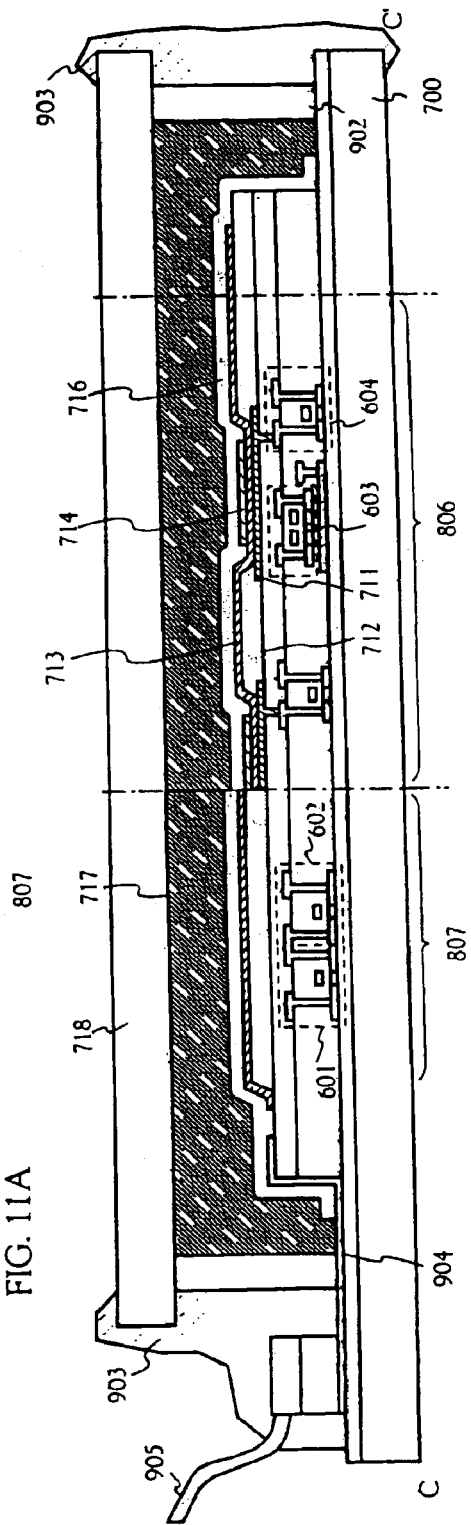

Furthermore, explained is a light emitting device of the embodiment having done the process up to sealing (or encapsulation) for protecting the light emitting elements, using FIGS. 11A and 11B. Incidentally, the reference numerals used in FIG. 10 are cited as required.

FIG. 11A is a top view showing a state done up to scaling (of the light emitting elements while FIG. 11B is a sectional view taken on line C–C' in FIG. 11A. 801 designated by the dotted line is a source driver circuit, 806 a pixel portion and 807 a gate driver circuit. In addition, 718 is the cover member, 902 a first seal member and 903 a second seal member. The sealing material 717 is provided at the inside surrounded by the first seal member 902.

Incidentally, 904 is a wiring to transmit a signal to be inputted to a source driver circuit 801 and gate driver circuit 807, to receive a video signal or clock signal from an FPC (Flexible Print Circuit) 905 as an external input terminal. Although only FPC is shown herein, the FPC may be attached with a printed wiring board (PWB). The light emitting device in this specification includes not only a light emitting device main body but also such a device in the state attached with an FPC or PWB.

Next, explanation is made on the sectional structure, by using FIG. 11B. The pixel portion 806 and the gate driver circuit 807 are formed over the substrate 700. The pixel portion 806 is formed with a plurality of pixels each including a current control TFT 604 and a pixel electrode 711 electrically connected to a drain thereof. Meanwhile, the gate driver circuit 807 is formed using a CMOS circuit having a combination of an n-channel TFT 601 and a p-channel TFT 602 (see FIG. 10).

The pixel electrode 711 serves as an anode of a light emitting element. Meanwhile, banks 712 are formed on the both ends of the pixel electrode 711. On the pixel electrode 711, a light emitting layer 713 and a cathode 714 of a light emitting element are formed.

The cathode 714 serves also as a wiring common to all the pixels and electrically connected to the FPC 905 by way of an connection wiring 904. Furthermore, all the elements included in the pixel portion 806 and gate driver circuit 807 are covered by the cathode 714 and passivation film 716.

Meanwhile, a cover member 718 is bonded by the first seal member 902. Incidentally, a resin film spacer may be provided in order to secure a spacing between the cover member 901 and the light emitting elements. The sealing material 717 is filled inside the first seal member 902. Incidentally, the first seal member 902 and the sealing material 717 preferably uses epoxy resin. Meanwhile, the first seal member 902 is preferably of a material to transmit water and oxy(en to a possible less extent. Furthermore, the encapsulation material 907 may contain a substance having a hygroscopic effect or an antioxidant effect.

The sealing material 717 covering the light emitting elements selves also as an adhesive to bond the cover member 718. Meanwhile, in this embodiment, as a material for the plastic substrate 718 forming the cover member 718 can be used, FRP (Fiberglass-Reinforced Plastics), PVF (polyvinyl Fluoride), myler, polyester or acryl.

Meanwhile, after bonding the cover member 718 by using the sealing material 717, a second seal member 903 is provided so as to cover the side surface (exposed surface) of the sealing material 717. For the second seal member 903 can be used the same material as the first seal member 902.

With the above structure, by encapsulating the light emitting elements in the sealing material 717, the light emitting elements can be completely shielded from the outside. It is possible to prevent the intrusion, front the external, of the substance, such as water or oxygen, which accelerates the deterioration in the light emitting layer. Thus, a reliable light emitting device can be obtained.

The light emitting device formed as described above is manufactured using TFTs in which the number of grains to be included in the active regions, in particular, the channel forming regions is averaged. Thus, a variation in an electrical characteristic can be reduced and uneven display of a display portion in various semiconductor devices can be suppressed.

[Embodiment 7]

The various electro-optic devices (active matrix liquid crystal display device, active matrix light emitting device, and active matrix EC display device) can be manufactured by applying the present invention. Thus, the present invention can be implemented to every electronic apparatus in which the electro-optic device incorporated in the display portion.

As such electronic apparatus, there are pointed out a video camera, a digital camera, a projector, a head mount display (goggle type display), a car navigation, a car stereo, a personal computer, a portable information terminal (mobile computer, portable telephone or electronic book) and the like. Examples of these are shown in FIGS. 12A to 14C.

FIG. 12A shows a personal computer including a main body 3001, an image input portion 3002, a display portion 3003 and a keyboard 3004. The present invention can applied to the display portion 3003.

FIG. 12B shows a video camera including a main body 3101, a display portion 3102, a voice input portion 3103, operation switches 3104, a battery 3105 and an image receiving portion 3106. The present invention can be applied to the display portion 3102.

FIG. 12C shows a mobile computer including a main body 3201, a camera portion 3202, an image receiving portion 3203, an operation switch 3204 and a display portion 3205. The present invention can be applied to the display portion 3205.

FIG. 12D shows a goggle type display including a main body 3301, a display portion 3302 and an arm portion 3303. The present invention can be applied to the display portion 3302.

FIG. 12E shows a player using a recording medium recorded with programs (hereinafter, referred to as recording medium) including a main body 3401, a display portion 3402, a speaker portion 3403, a record medium 3404 and an operation switch 3405. The player uses DVD (Digital Versatile Disc) or CD as the record medium and can enjoy music, enjoy movie and carry out game or Internet. The present invention can be applied to the display portion 3402.

FIG. 12F shows a digital camera including a main body 3501, a display portion 3502, an eye contact portion 3503, operation switches 3504 and an image receiving portion (not illustrated). The present invention can be applied to the display portion 3502.

Figure 13A:
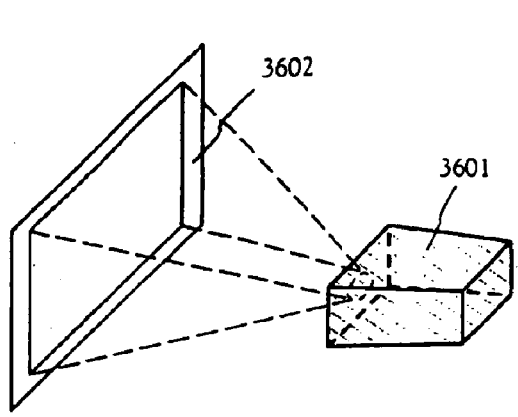
FIGS. 13A to 13D show examples of electrical apparatuses of Embodiment 7.

FIG. 13A shows a front type projector including a projection device 3601 and a screen 3602. The present invention can be applied to the liquid crystal display device 3808, which comprises a part of the projection device 3601, and other driver circuits.

Figure 13B:
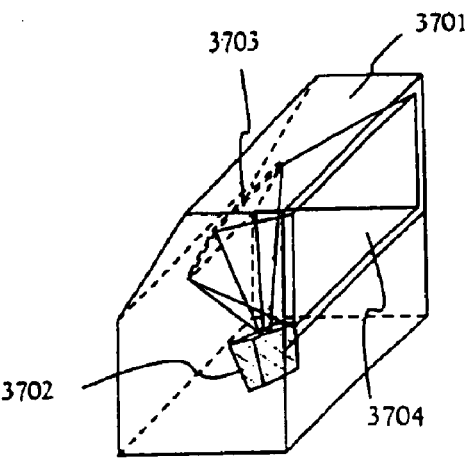

FIG. 13B shows a rear type projector including a main body 3701, a projection device 3702, a mirror 3703 and a screen 3704. The present invention can be applied to the liquid crystal display device 3808, which comprises a part of the projection device 3702, and other driver circuits.

Figure 13C:
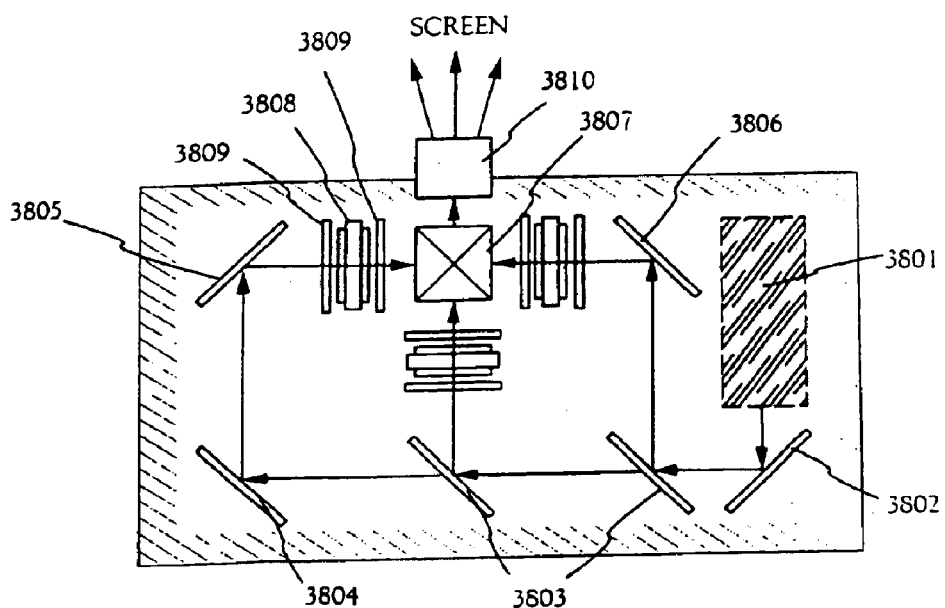

Further, FIG. 13C is a view showing an example of a structure of the projection apparatus 3601 and 3702 in FIG. 13A and FIG. 13B. The projection apparatus 3601 or 3702 is constituted by a light source optical system 3801, mirrors 3802, and 3804 through 3806, a dichroic mirror 3803, a prism 3807, a liquid crystal display device 3808, a phase difference plate 3809 and a projection optical system 3810. The projection optical system 3810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 13C.

Figure 13D:
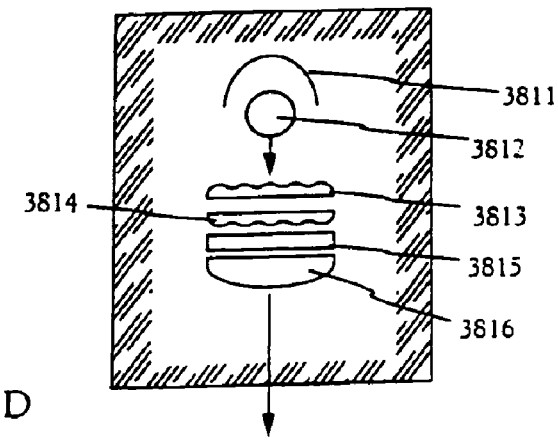

Further, FIG. 13D is a view showing an example of a structure of the light source optical system 3801 in FIG. 13C. According to the embodiment, the light source optical system 3801 is constituted by a reflector 3811, a light source 3812, lens arrays 3813 and 3814, a polarization conversion element 3815 and a focusing lens 3816. Further, the light source optical system shown in FIG. 13D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIG. 13, there is shown a case of using a transmission type electro-optic device and an example of applying a reflection type electro-optic device and a light emitting device are not illustrated.

Figure 14A:
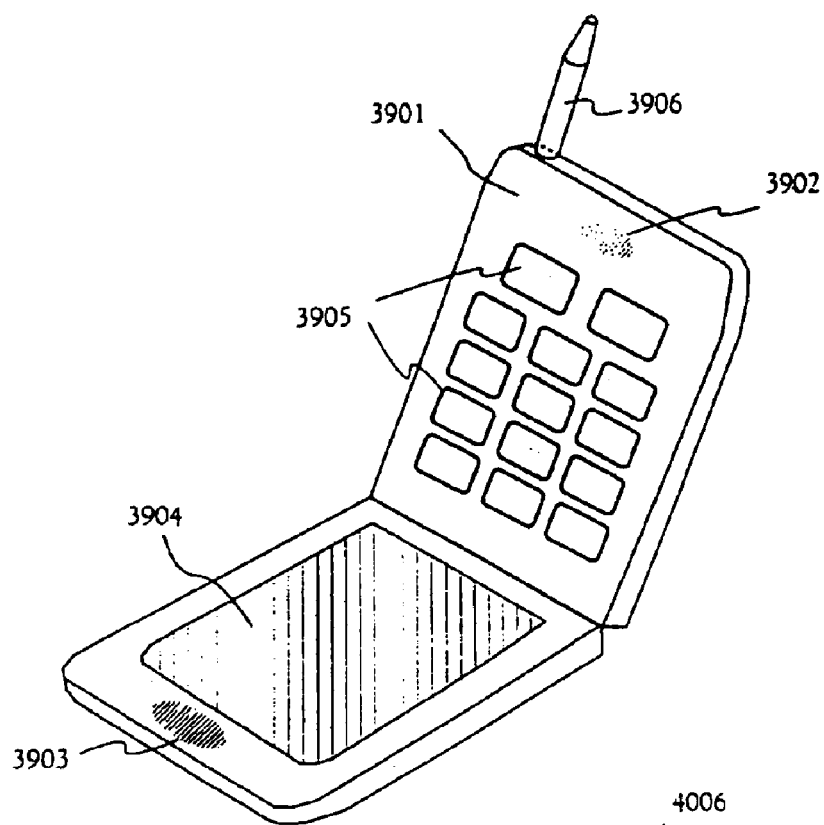
FIGS. 14A to 14C show examples of electrical apparatuses of Embodiment 7.

FIG. 14A shows a portable telephone including a main body 3901, a voice output portion 3902, a voice input portion 3903, a display portion 3904, an operation switch 3905 and an antenna 3906. The present invention can be applied to the display portion 3904.

Figure 14B:
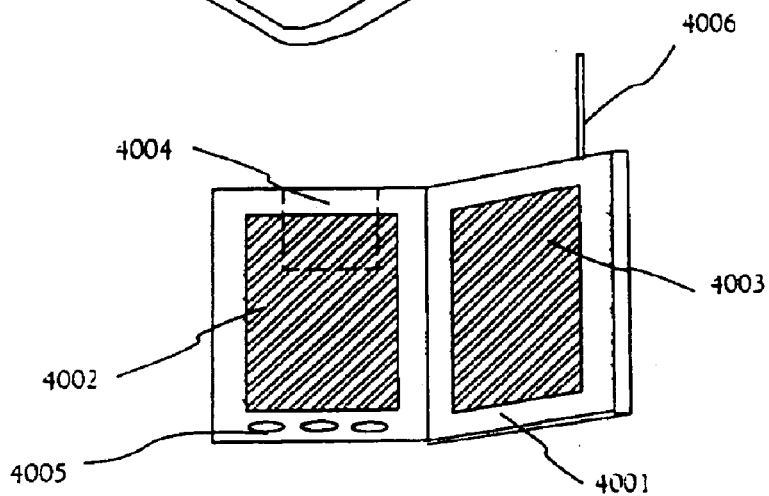

FIG. 14B shows a portable book (electronic book) including, a main body 4001, display portions 4002 and 4003, a record medium 4004, an operation switch 4005 and an antenna 4006. The present invention can be applied to the display portions 4002 and 4003.

Figure 14C:
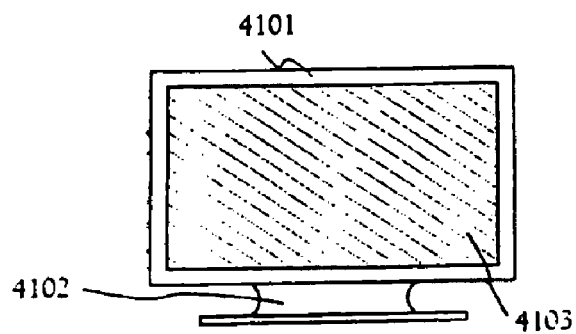

FIG. 14C shows a display including a main body 4101, a support base 4102 and a display portion 4103. The invention can be applied to the display portion 4103. The invention is particularly advantageous to a large-screen display, and is advantageous to a display having a diagonal size of 10 inches or more (particularly, 30 inches or more).

As has been described, the range of applying the invention is extremely wide and is applicable to electronic apparatus of all the fields. The electronic apparatus of this embodiment can be implemented by freely combined with Embodiments 1 to 4, or 5.

When the structure of the present invention is employed, the following basic significance can be obtained.

(a) This is a simple method suitable for a conventional TFT manufacturing process.

(b) A generation density of a crystal nucleus can be controlled.

(c) While the above advantages are obtained, a crystalline semiconductor film having preferable crystallinity can be formed. When such a crystalline semiconductor film is used, a TFT having a superior electrical characteristic can be manufactured. Also, when such a TFT is used for a display portion in various semiconductor devices, uneven display can be suppressed.

What is claimed is:

1. A method of manufacturing a semiconductor device, the method comprising the steps of:

forming a first insulating film at a first temperature;

forming a second insulating film at a second temperature;

forming a semiconductor film on the second insulating film at a third temperature;

adding a metallic element to the semiconductor film;

performing a thermal treatment at a fourth temperature to the semiconductor film added with the metallic element to form a crystalline semiconductor film; and forming a light emitting layer over the semiconductor film, wherein the fourth temperature is higher than the first temperature, the second temperature and the third temperature; and wherein a nitrogen concentration of the first insulating film is higher than a nitrogen concentration of the second insulating film.

2. The method according to claim 1, wherein the fourth temperature is higher than the first temperature, the second temperature and the third temperature to increase a stress of the second insulating film.

3. The method according to claim 1, wherein the thermal treatment is performed at the fourth temperature to the semiconductor film added with the metallic element to increase a stress of the second insulating film, wherein a generation density of crystal nuclei in the crystalline semiconductor film is increased by increasing the stress of the second insulating film.

4. The method according to claim 1,
wherein the semiconductor film comprises silicon.

5. The method according to claim 1,
wherein the semiconductor film is formed through a low pressure CVD method.

6. The method according to claim 1,
wherein a grain size formed in the crystalline semiconductor film is in a range of 20 µm to 60 µm.

7. The method according to claim 1,
wherein the semiconductor device is an active matrix type liquid crystal display device.

8. The method according to claim 1,
wherein the semiconductor device is an active matrix type electroluminescence display device.

9. The method according to claim 1,
wherein the semiconductor device is one selected from the group consisting of a personal computer, a video camera, a mobile computer, a goggle type display, a player using a recording medium recorded with programs, a digital camera, a front type projector, a rear type projector, a portable telephone, a portable book, and a display.

10. A method of manufacturing a semiconductor device, the method comprising the steps of:

forming a first insulating film at a first temperature;

forming a second insulating film at a second temperature;

forming a semiconductor film on the second insulating film at a third temperature;

adding a metallic element to the semiconductor film; and performing a thermal treatment at a fourth temperature to the semiconductor film added with the metallic element to form a crystalline semiconductor film; and forming a light emitting layer over the semiconductor film, wherein the first temperature is higher than the fourth temperature; and wherein the fourth temperature is higher than the second temperature and the third temperature.

11. The method according to claim 10,
wherein the fourth temperature is higher than the second temperature and the third temperature to increase a stress of the second insulating film.

12. The method according to claim 10,
wherein the thermal treatment is performed at the fourth temperature to the semiconductor film added with the metallic element to increase a stress of the second insulating film,
wherein a generation density of crystal nuclei in the crystalline semiconductor film is increased by increasing the stress of the second insulating film.

13. The method according to claim 10,
wherein the semiconductor film comprises silicon.

14. The method according to claim 10,
wherein the semiconductor film is formed through a low pressure CVD method.

15. The method according to claim 10,
wherein a grain size formed in the crystalline semiconductor film is in a range of 20 µm to 60 µm.

16. The method according to claim 10,
wherein the second insulating film comprises nitrogen.

17. The method according to claim 10,
wherein the semiconductor device is an active matrix type liquid crystal display device.

18. The method according to claim 10,
wherein the semiconductor device is an active matrix type electroluminescence display device.

19. The method according to claim 10,
wherein the semiconductor device is one selected from the group consisting of a personal computer, a video camera, a mobile computer, a goggle type display, a player using a recording medium recorded with programs, a digital camera, a front type projector, a rear type projector, a portable telephone, a portable book, and a display.

* * * * *